(12) United States Patent
Eom et al.

(10) Patent No.: US 11,270,958 B2
(45) Date of Patent: Mar. 8, 2022

(54) SEMICONDUCTOR PACKAGE INCLUDING CAPACITOR

(71) Applicant: SK hynix Inc., Icheon-si (KR)

(72) Inventors: Ju Il Eom, Icheon-si (KR); Jin Kyoung Park, Icheon-si (KR); Han Jun Bae, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/991,683

(22) Filed: Aug. 12, 2020

(65) Prior Publication Data

US 2021/0366847 A1 Nov. 25, 2021

(30) Foreign Application Priority Data

May 22, 2020 (KR) ........................ 10-2020-0061540

(51) Int. Cl.
| | |
|---|---|
| *H01L 23/64* | (2006.01) |
| *H01L 23/528* | (2006.01) |
| *H01L 23/31* | (2006.01) |
| *H01L 23/00* | (2006.01) |
| *H01L 49/02* | (2006.01) |

(52) U.S. Cl.
CPC ........ *H01L 23/642* (2013.01); *H01L 23/3128* (2013.01); *H01L 23/5286* (2013.01); *H01L 24/13* (2013.01); *H01L 24/45* (2013.01); *H01L 24/73* (2013.01); *H01L 28/60* (2013.01); *H01L 2224/73257* (2013.01)

(58) Field of Classification Search
CPC ............... H01L 23/642; H01L 23/3128; H01L 23/5286
See application file for complete search history.

(56) References Cited

U.S. PATENT DOCUMENTS

2018/0130782 A1* 5/2018 Lee ..................... H01L 24/09
2020/0312797 A1* 10/2020 Kang ............... H01L 23/49822

FOREIGN PATENT DOCUMENTS

KR    1020180052351 A    5/2018
KR     102026132 B1     9/2019

* cited by examiner

*Primary Examiner* — Errol V Fernandes
(74) *Attorney, Agent, or Firm* — William Park & Associates Ltd.

(57) ABSTRACT

A semiconductor package includes: a sub semiconductor package disposed over a substrate, the sub semiconductor package including a sub semiconductor chip which has chip pads on its upper surface, a molding layer which surrounds side surfaces of the sub semiconductor chip, and a redistribution layer formed over the sub semiconductor chip and the molding layer, the redistribution layer including redistribution conductive layers which are connected to the chip pads of the sub semiconductor chip and extend onto edges of the molding layer while having redistribution pads on their end portions; first sub package interconnectors connected to the redistribution pads to electrically connect the sub semiconductor chip and the substrate; a capacitor formed in the molding layer and including a first electrode, a second electrode, and a body portion, the first and second electrodes having upper surfaces which are connected to the redistribution conductive layers, respectively.

23 Claims, 18 Drawing Sheets

US 11,270,958 B2

SEMICONDUCTOR PACKAGE INCLUDING CAPACITOR

CROSS-REFERENCE TO RELATED APPLICATION

This application claims priority under 35 U.S.C. § 119 to Korean Patent Application No. 10-2020-0061540 filed on May 22, 2020, which is incorporated herein by reference in its entirety.

BACKGROUND

1. Technical Field

This patent document relates to a semiconductor package, and more particularly, to a semiconductor package including a capacitor.

2. Related Art

Recently, demands for high-speed operation and high-capacity data processing of semiconductor devices have increased. For this, it is required to increase the number of signals simultaneously transmitted to the semiconductor device or the signal transmission speed.

However, there is a problem in that power/ground noise increases as the semiconductor device operates at a high speed and the number of signals simultaneously transmitted increases. Therefore, a method of adding a capacitor for stabilizing power/ground supply, that is, a decoupling capacitor, to a power transmission path is currently used.

SUMMARY

In an embodiment, a semiconductor package may include: a substrate; a sub semiconductor package disposed over the substrate, the sub semiconductor package including a sub semiconductor chip which has chip pads on its upper surface, a molding layer which surrounds side surfaces of the sub semiconductor chip, and a redistribution layer formed over the sub semiconductor chip and the molding layer, the redistribution layer including redistribution conductive layers which are connected to the chip pads of the sub semiconductor chip and extend onto edges of the molding layer while having redistribution pads on their end portions; first sub package interconnectors connected to the redistribution pads to electrically connect the sub semiconductor chip and the substrate; a capacitor formed in the molding layer and including a first electrode, a second electrode, and a body portion between the first electrode and the second electrode, the first and second electrodes having upper surfaces which are connected to the redistribution conductive layers, respectively; and at least one main semiconductor chip formed over the sub semiconductor package and electrically connected to the substrate.

DETAILED DESCRIPTION

Figure 1:
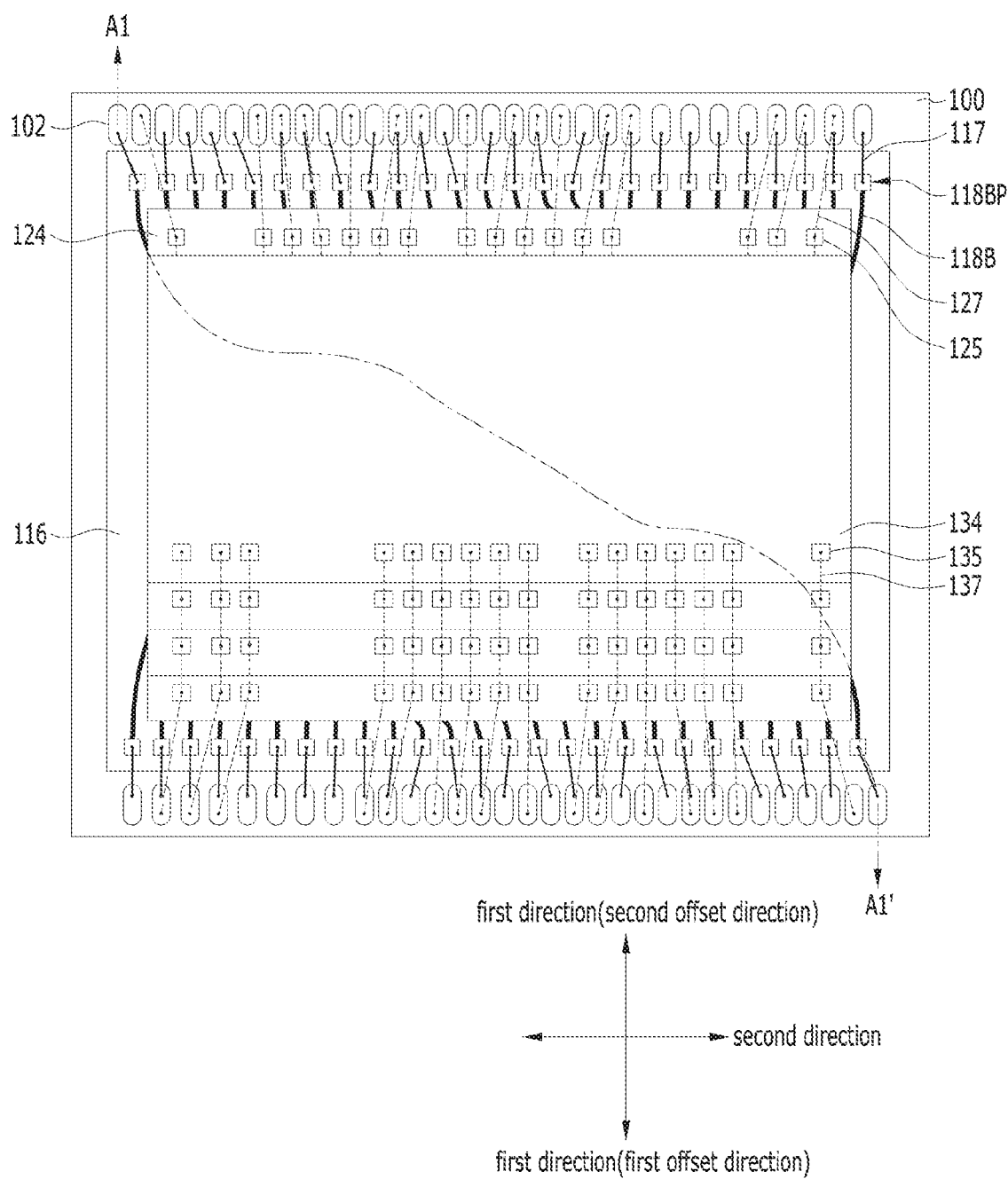
FIG. 1 is a planar view illustrating a semiconductor package in accordance with an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
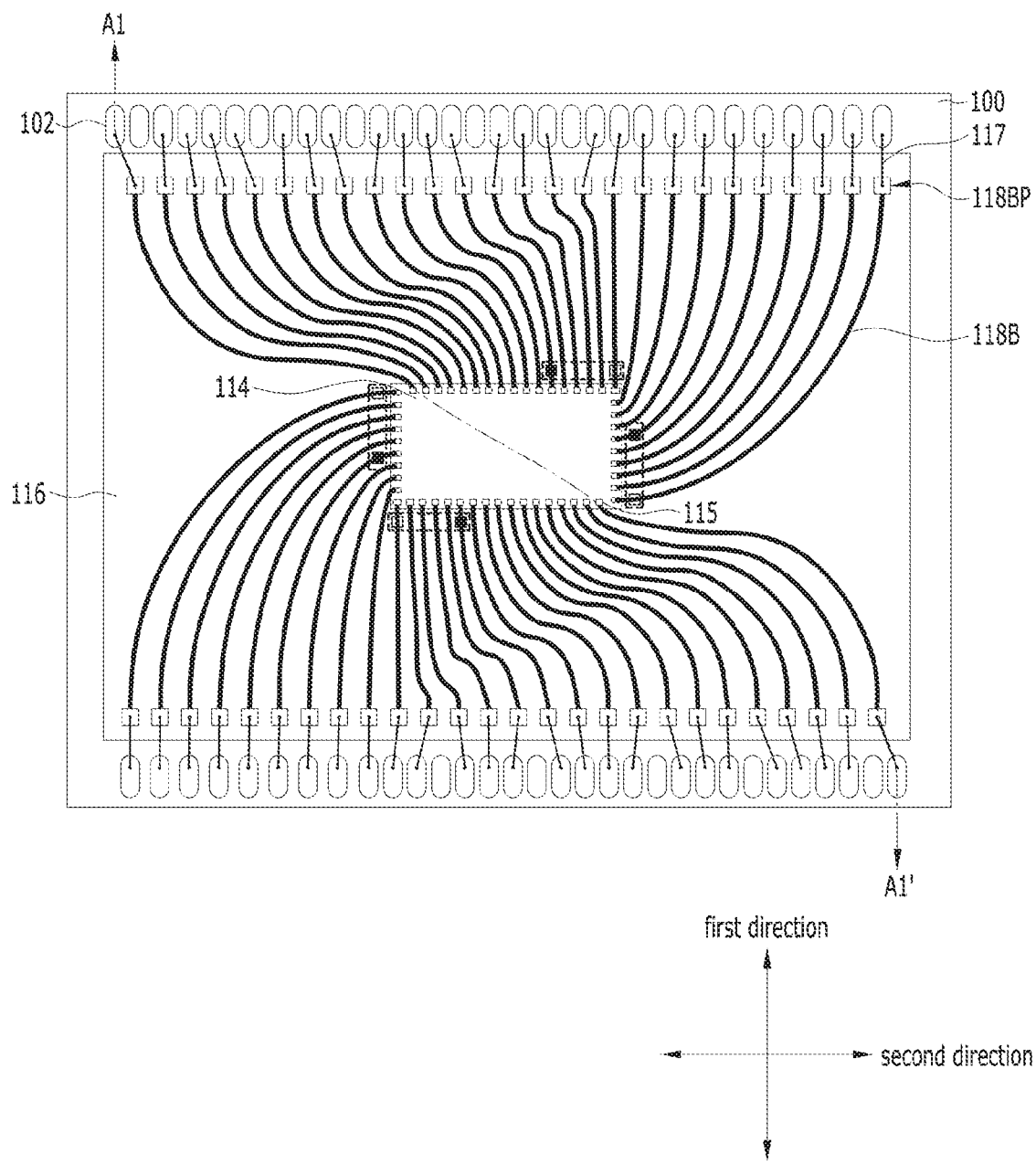
FIG. 2 is a planar view illustrating a part of the semiconductor package illustrated in FIG. 1, with a first chip stack, a second chip stack, and interconnectors connected with the first and second chip stacks omitted.
Figure 3:
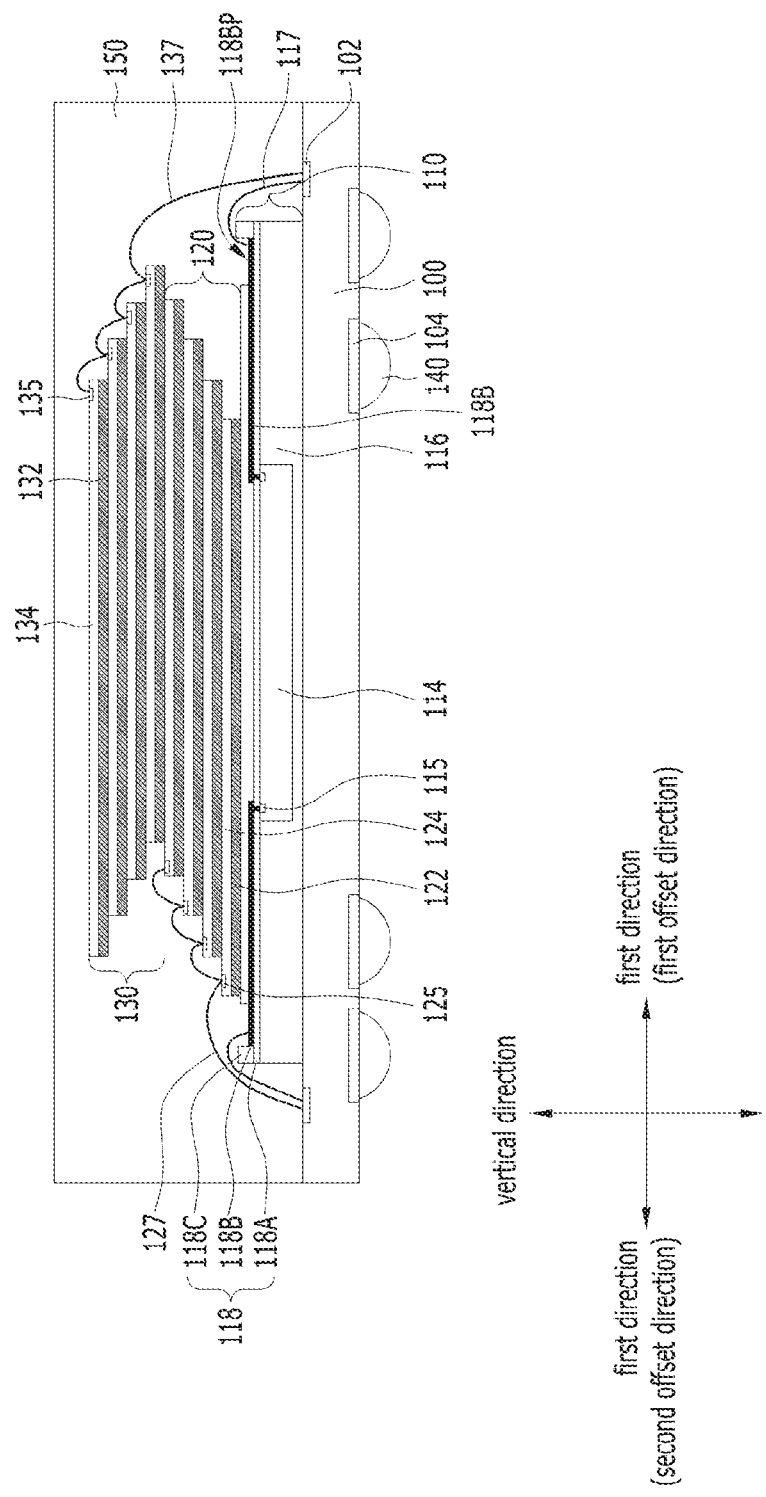
FIG. 3 is a cross-sectional view illustrating the semiconductor package illustrated in FIG. 1.
Figure 4:
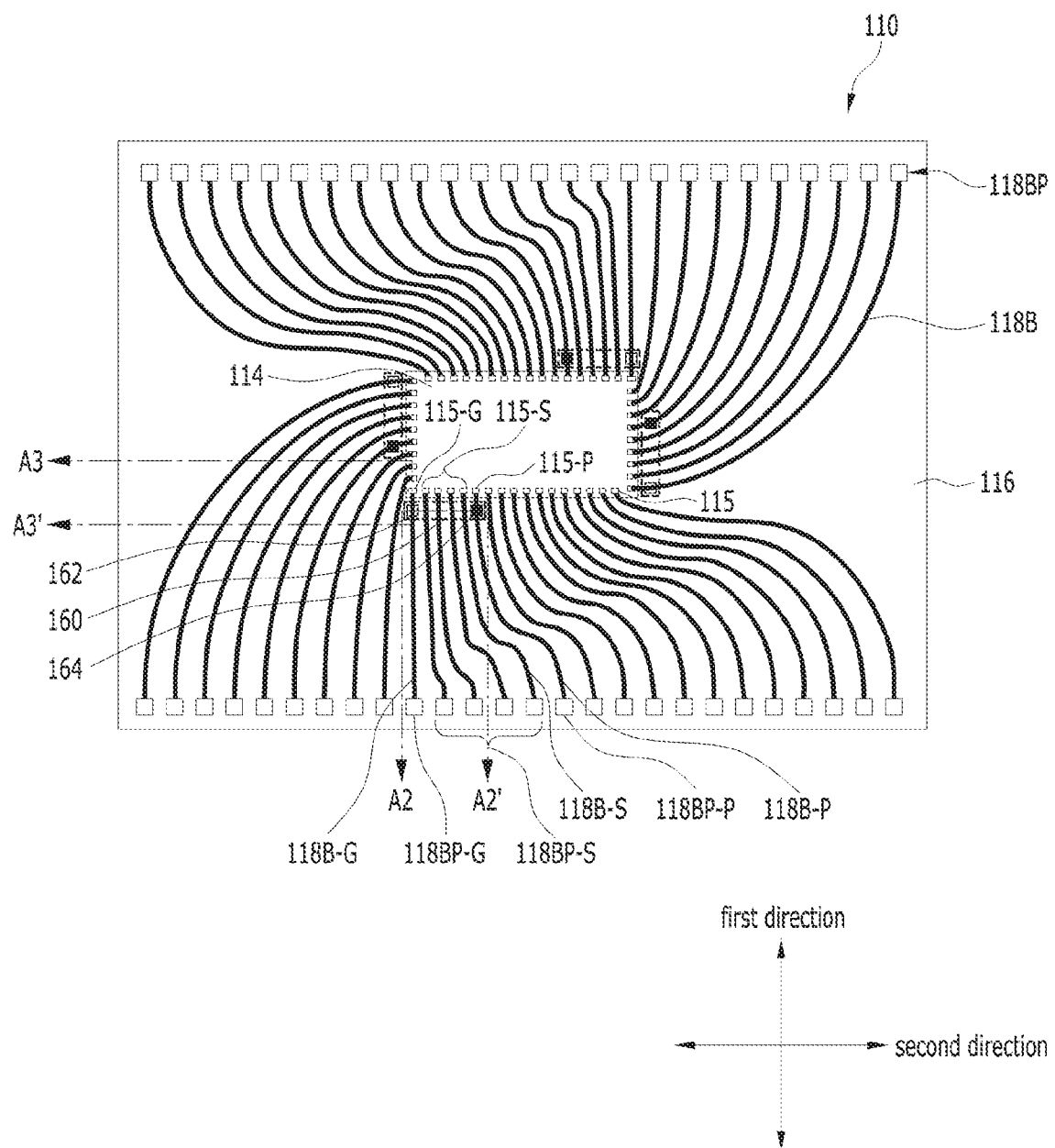
FIG. 4 is a planar view illustrating a sub semiconductor package of FIG. 1.
Figure 5:
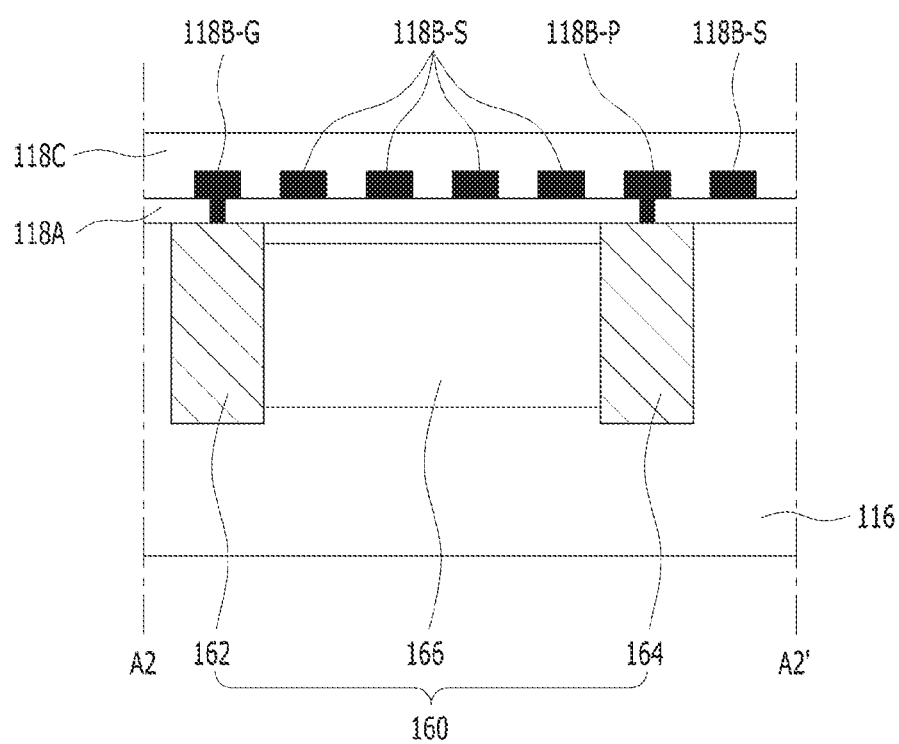
FIG. 5 is a cross-sectional view taken along a line A2-A2' of FIG. 4.
Figure 6:
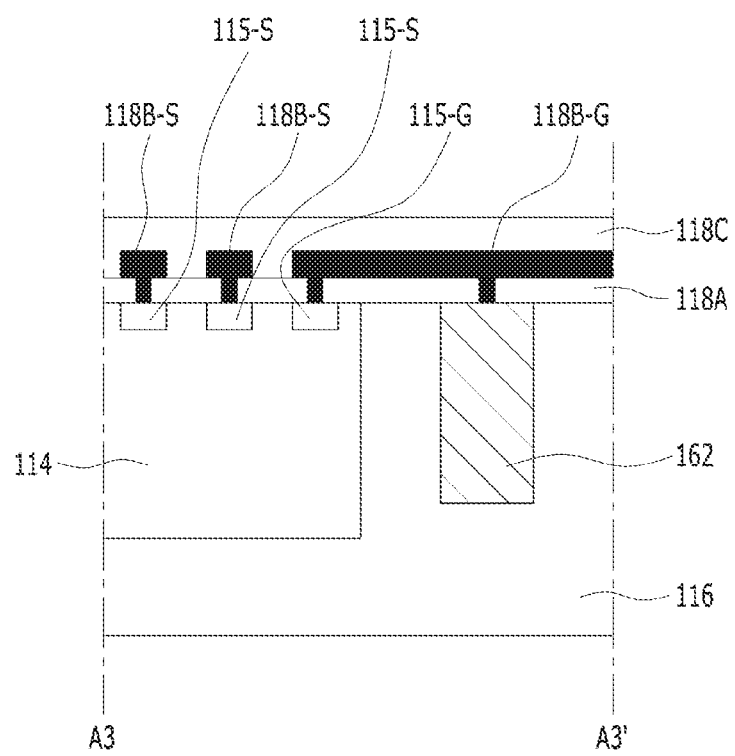
FIG. 6 is a cross-sectional view taken along a line A3-A3' of FIG. 4.

FIG. 1 is a planar view illustrating a semiconductor package in accordance with an embodiment of the present disclosure. FIG. 2 is a planar view illustrating a part of the semiconductor package illustrated in FIG. 1, with a first chip stack, a second chip stack, and interconnectors connected with the first and second chip stacks omitted. FIG. 3 is a cross-sectional view illustrating the semiconductor package of FIG. 1. FIGS. 1 and 2 are top views of the semiconductor package and the part thereof, respectively. FIG. 3 illustrates a cross-section taken along a line A1-A1' of FIGS. 1 and 2. FIG. 4 is a planar view illustrating a sub semiconductor package of FIG. 1, FIG. 5 is a cross-sectional view taken along a line A2-A2' of FIG. 4, and FIG. 6 is a cross-sectional view taken along a line A3-A3' of FIG. 4.

First, referring to FIGS. 1 to 3, the semiconductor package in accordance with the embodiment of the present disclosure may include a substrate 100, a sub semiconductor package 110 which is disposed over the substrate 100, and first and second chip stacks 120 and 130 which are disposed over the sub semiconductor package 110.

The substrate 100 may be a substrate for a semiconductor package, which has a circuit and/or wiring structure to transfer electrical signals, such as a printed circuit board (PCB).

The substrate 100 may have an upper surface and a lower surface located opposite to the upper surface. The sub semiconductor package 110, the first chip stack 120, and the second chip stack 130 may be disposed over the upper surface of the substrate 100. External connection terminals 140 for connecting the semiconductor package with the outside may be disposed over the lower surface of the substrate 100. For reference, an upper surface and a lower surface to be described below are expressions to indicate relative positions of various surfaces of a component, and do not indicate absolute positions. For example, in the case where the semiconductor package is turned upside down unlike the illustration, a surface over which the sub semiconductor package 110 and the first and second chip stacks 120 and 130 are disposed may be a lower surface of the substrate 100 and a surface over which the external connection terminals 140 are disposed may be an upper surface of the substrate 100.

The substrate 100 may include upper surface substrate pads 102 and lower surface substrate pads 104. The upper surface substrate pads 102 may be disposed on the upper surface of the substrate 100 to electrically connect the sub semiconductor package 110, the first chip stack 120, and the second chip stack 130 with the substrate 100. The lower surface substrate pads 104 may be disposed on the lower surface of the substrate 100 to electrically connect the external connection terminals 140 with the substrate 100. For reference, substrate pads may mean electrically conductive elements or terminals which are exposed on the surfaces of the substrate 100 to electrically connect the substrate 100 with other components. As an example, the upper surface substrate pads 102 may be bond fingers for wire bonding, and the lower surface substrate pads 104 may be ball lands for bonding with solder balls. The upper surface substrate pads 102 and the lower surface substrate pads 104 may be connected with a circuit and/or wiring structure inside the substrate 100.

The upper surface substrate pads 102 may be disposed at both side edges of the substrate 100 which do not overlap with the sub semiconductor package 110. For example, the upper surface substrate pads 102 may be disposed at both side edges of the substrate 100 in a first direction. For reference, a first side of both sides in the first direction may correspond to an upper side of FIGS. 1 and 2, and a left side of FIG. 3. Also, a second side of the both sides in the first direction may correspond to a lower side of FIGS. 1 and 2, and a right side of FIG. 3. In the present embodiment, the upper surface substrate pads 102 may be arranged in a line in a second direction intersecting with the first direction, at each of the both side edges of the substrate 100. However, the present embodiment is not limited thereto, and the number, arrangement, or the like of the upper surface substrate pads 102 may be variously modified, at each of the both side edges of the substrate 100.

The sub semiconductor package 110 may have a planar area smaller than the upper surface of the substrate 100. The sub semiconductor package 110 may be disposed to expose at least the both side edges of the substrate 100 in the first direction and/or the upper surface substrate pads 102. As an example, the sub semiconductor package 110 may be disposed at a center region of the substrate 100. The sub semiconductor package 110 may be attached to the upper surface of the substrate 100 by an insulating adhesive material (not shown), such as a die attach film (DAF).

The sub semiconductor package 110 may include a sub semiconductor chip 114, a sub molding layer 116 which surrounds lower and side surfaces of the sub semiconductor chip 114, and a redistribution structure 118 which is formed over upper surfaces of the sub semiconductor chip 114 and the sub molding layer 116.

The sub semiconductor chip 114 may be a semiconductor chip which perform various functions required for operations of first main semiconductor chips 124 and/or second main semiconductor chips 134. As an example, in the case where each of the first and second main semiconductor chips 124 and 134 includes nonvolatile memory such as NAND flash memory, the sub semiconductor chip 114 may include a controller for controlling the first and second main semiconductor chips 124 and 134. However, the present embodiment is not limited thereto, and the sub semiconductor chip 114 may include volatile memory such as dynamic random access memory (DRAM) and static RAM (SRAM), nonvolatile memory such as NAND flash, resistive RAM (RRAM), phase-change RAM (PRAM), magnetoresistive RAM (MRAM) and ferroelectric RAM (FRAM), or other various active elements or passive elements.

The sub semiconductor chip 114 may have a lower surface which faces the upper surface of the substrate 100, an upper surface which is located opposite to the lower surface thereof, and side surfaces which connect the upper surface and the lower surface thereof. In the present embodiment, the sub semiconductor chip 114 may have four side surfaces. The four side surfaces may be positioned at both sides in the first direction and at both sides in the second direction, respectively. For reference, a first side of the both sides in the second direction may correspond to a right side of FIGS. 1 and 2, and a second side of the both sides in the second direction may correspond to a left side of FIGS. 1 and 2.

The sub semiconductor chip 114 may be positioned at a center region of the sub semiconductor package 110. This is to make lengths of redistribution conductive layers 118B, which will be described later, as similar to each other as possible.

Sub chip pads 115 may be disposed on the upper surface of the sub semiconductor chip 114. The sub semiconductor chip 114 may have a relatively small planar area, whereas the number of the sub chip pads 115 may be relatively large. As an example, a case where the sub semiconductor chip 114 is a memory controller and the first and second main semiconductor chips 124 and 134 are memories may be assumed. In this case, while the size of the sub semiconductor chip 114 decreases with the development of technology, a number of sub chip pads 115 corresponding to a number of input/output signals may be required, in order to connect the respective first and second chip stacks 120 and 130 and the sub semiconductor chip 114 through independent channels. Because of this fact, the sub chip pads 115 may be arranged along the entire edges of the sub semiconductor chip 114. That is to say, the sub chip pads 115 may be arranged along first and second side edges of the sub semiconductor chip 114 in the first direction, and along first and second side edges of the sub semiconductor chip 114 in the second direction.

The sub molding layer 116 may have an upper surface having substantially the same height as the upper surface of the sub semiconductor chip 114 while surrounding the side surfaces of the sub semiconductor chip 114. Therefore, the sub molding layer 116 may expose the upper surface of the sub semiconductor chip 114 and the sub chip pads 115. In the present embodiment, the sub molding layer 116 may cover the lower surface of the sub semiconductor chip 114. However, the present embodiment is not limited thereto. In another embodiment, the sub molding layer 116 may have a lower surface having substantially the same height as the lower surface of the sub semiconductor chip 114. The sub molding layer 116 may include various molding materials such as an epoxy molding compound (EMC).

The redistribution structure 118 may extend onto the upper surface of the sub molding layer 116 while being electrically connected with the sub chip pads 115. In other words, the sub semiconductor package 110 according to the present embodiment may be a fan-out package.

In detail, the redistribution structure 118 may include a first redistribution insulating layer 118A, redistribution conductive layers 118B, and a second redistribution insulating layer 118C. The first redistribution insulating layer 118A may be formed over the upper surfaces of the sub semiconductor chip 114 and the sub molding layer 116. The first redistribution insulating layer 118A may have openings exposing the sub chip pads 115. The redistribution conductive layers 118B may be formed over the first redistribution insulating layer 118A. The redistribution conductive layers 118B may be electrically connected with the sub chip pads 115 through the openings of the first redistribution insulating layer 118A. The second redistribution insulating layer 118C may cover the first redistribution insulating layer 118A and the redistribution conductive layers 118B. The second redistribution insulating layer 118C may have openings exposing ends of the redistribution conductive layers 118B. The first redistribution insulating layer 118A and the second redistribution insulating layer 118C may include an insulating material such as oxide, nitride, or oxynitride. Alternatively, the first redistribution insulating layer 118A and the second redistribution insulating layer 118C may include a resin material such as epoxy, polyimide, polybenzoxazole (PBO), benzocyclobuten (BCB), silicone, or acrylate. The redistribution conductive layers 118B may include a metal material such as gold, copper, or a copper alloy.

Specifically, portions of the redistribution conductive layers 118B, which are exposed by the openings of the second redistribution insulating layer 118C, will be hereinafter referred to as redistribution pads 118BP. The redistribution conductive layers 118B may extend from the sub chip pads 115, and each redistribution conductive layer 118B may have a line-shaped portion having a relatively small width and a plate-shaped end having a relatively large width while being positioned at an end of the line-shaped portion. The opening of the second redistribution insulating layer 118C may expose the plate-shaped end of the redistribution conductive layer 118B, and may have a planar area less than or equal to a planar area of the plate-shaped end while overlapping the plate-shaped end. In the top views of FIGS. 1 and 2, for the sake of convenience in explanation, the first and second redistribution insulating layers 118A and 118C of the redistribution structure 118 are not illustrated. The redistribution pads 118BP may be disposed at first and second side edges of the sub molding layer 116 in the first direction, similarly to the disposition of the upper surface substrate pads 102. Furthermore, the redistribution pads 118BP may be arranged in a line in the second direction at each of the first and second side edges of the sub molding layer 116. However, the present disclosure is not limited thereto, and the number, arrangement, or the like of the redistribution pads 118BP may be variously modified, at each of the first and second side edges of the sub molding layer 116.

According to the arrangement of the redistribution pads 118BP, the redistribution conductive layers 118B may extend from the sub chip pads 115 disposed at the first side edges of the sub semiconductor chip 114 in the first and second directions to the redistribution pads 118BP disposed at the first side edge of the sub molding layer 116 in the first direction. Also, the redistribution conductive layers 118B may extend from the sub chip pads 115 disposed at the second side edges of the sub semiconductor chip 114 in the first and second directions to the redistribution pads 118BP disposed at the second side edge of the sub molding layer 116 in the first direction. The redistribution conductive layers 118B, which extend from the both side edge of the sub semiconductor chip 114 in the second direction, may have curved shapes toward the redistribution pads 118BP. Meanwhile, the redistribution conductive layers 118B, which extend from the both side edge of the sub semiconductor chip 114 in the first direction, may not need to be bent because these redistribution conductive layers 118B face the redistribution pads 118BP. However, in order to have lengths similar to lengths of the redistribution conductive layers 118B extending from the both side edges of the sub semiconductor chip 114 in the second direction, the redistribution conductive layers 118B extending from the both side edges of the sub semiconductor chip 114 in the first direction may also have curved shapes. As a result, the redistribution conductive layers 118B may have a shape similar to a tornado, for example, a spiral shape, centering on the sub semiconductor chip 114. Through such a connection scheme, it may be possible to reduce variations in the lengths of the redistribution conductive layers 118B.

Sub package interconnectors 117 may connect the redistribution pads 118BP and the upper surface substrate pads 102. By this fact, the sub semiconductor chip 114 and the substrate 100 may be electrically connected. The sub package interconnectors 117 may be bonding wires having first ends which are connected with the upper surface substrate pads 102 and second ends which are connected with the redistribution pads 118BP. However, the present embodiment is not limited thereto, and various types of electrical interconnectors may be used as the sub package interconnectors 117.

The first chip stack 120 may include a plurality of first main semiconductor chips 124. The first main semiconductor chips 124 may be formed over the sub semiconductor package 110, and may be stacked in a vertical direction with respect to the upper surface of the substrate 100. While the present embodiment illustrates a case where the first chip stack 120 includes four first main semiconductor chips 124, the present disclosure is not limited thereto, and the number of first main semiconductor chips 124 included in the first chip stack 120 may be variously modified to one or more first main semiconductor chips 124.

Each of the first main semiconductor chips 124 may include NAND flash memory as described above. However, the present disclosure is not limited thereto, and each of the first main semiconductor chips 124 may include volatile memory such as dynamic random access memory (DRAM) and static RAM (SRAM) or nonvolatile memory such as resistive RAM (RRAM), phase-change RAM (PRAM), magnetoresistive RAM (MRAM) and ferroelectric RAM (FRAM).

The first main semiconductor chips 124 may be stacked with a predetermined offset in a direction toward the second side in the first direction, for example, in a direction toward the lower side in FIG. 1 and the right side in FIG. 3. By this fact, the first chip stack 120 which has a step shape when viewed in its entirety may be formed. The offset stacking direction of the first main semiconductor chips 124 may be referred to as a first offset direction. According to such offset stacking, a first side edge of an upper surface of each of the remaining first main semiconductor chips 124, except the uppermost first main semiconductor chip 124 among the first main semiconductor chips 124, may be exposed without being covered by the first main semiconductor chip 124 lying immediately thereon. For example, the upper side of the upper surface of each of the remaining first main semiconductor chips 124 in FIG. 1 and the left side of the upper surface of each of the remaining first main semiconductor chips 124 in FIG. 3 may be exposed. A first side edge of an upper surface of the uppermost first main semiconductor chip 124 may be exposed without being covered by the lowermost second main semiconductor chip 134 of the second chip stack 130 which will be described later. First chip pads 125 may be disposed on such exposed portions of the first main semiconductor chips 124. A plurality of first chip pads 125 may be arranged in a line in the second direction at the first side edge of the upper surface of each of the first main semiconductor chips 124. However, the present disclosure is not limited thereto, and the number and arrangement of the first chip pads 125 at the first side edge of the upper surface of each of the first main semiconductor chips 124 may be variously modified. For reference, because a part of the first chip stack 120 which is hidden by the second chip stack 130 is not illustrated in the top view of FIG. 1, a portion of the first chip stack 120, for example, a first side edge portion of the lowermost first main semiconductor chip 124, is illustrated.

Each of the first main semiconductor chips 124 may be attached to the sub semiconductor package 110 or the first main semiconductor chip 124 lying immediately thereunder, by a first adhesive layer 122. The first adhesive layer 122 may be formed on the lower surface of each of the first main semiconductor chips 124 to have a shape overlapping with the lower surface.

The first chip stack 120 or the first main semiconductor chips 124 may have a planar area smaller than the sub semiconductor package 110, and may have a planar area larger than the sub semiconductor chip 114. The first chip stack 120 may be disposed to expose at least the redistribution pads 118BP disposed at the both side edges of the sub semiconductor package 110 in the first direction.

First interconnectors 127 may connect the first chip pads 125 adjacent in the vertical direction with each other, and may electrically connect the first chip pads 125 of the lowermost first main semiconductor chip 124 with the upper surface substrate pads 102 disposed at the first side edge of the substrate 100 in the first direction. By this fact, the first main semiconductor chips 124 may be electrically connected with one another, and the first chip stack 120 may be electrically connected with the substrate 100. The first interconnectors 127 may be bonding wires. However, the present embodiment is not limited thereto, and various types of electrical interconnectors may be used as the first interconnectors 127.

The second chip stack 130 may include a plurality of second main semiconductor chips 134. The second main semiconductor chips 134 may be formed over the first chip stack 120, and may be stacked in the vertical direction. While the present embodiment illustrates a case where the second chip stack 130 includes four second main semiconductor chips 134, the present disclosure is not limited thereto, and the number of second main semiconductor chips 134 included in the second chip stack 130 may be variously modified to one or more second main semiconductor chips 134. Also, while, in the present embodiment, the number of second main semiconductor chips 134 included in the second chip stack 130 is the same as the number of first main semiconductor chips 124 included in the first chip stack 120, it is to be noted that these numbers may be different from each other.

Each of the second main semiconductor chips 134 may include NAND flash memory as described above. However, the present disclosure is not limited thereto, and each of the second main semiconductor chips 134 may include volatile memory, such as dynamic random access memory (DRAM) and static RAM (SRAM), or nonvolatile memory, such as resistive RAM (RRAM), phase-change RAM (PRAM), magnetoresistive RAM (MRAM) and ferroelectric RAM (FRAM). In the present embodiment, the second main semiconductor chips 134 are the same semiconductor chips as the first main semiconductor chips 124. However, in another embodiment, the second main semiconductor chips 134 may be semiconductor chips different from the first main semiconductor chips 124.

The second main semiconductor chips 134 may be stacked with a predetermined offset in a direction toward the first side in the first direction, for example, in a direction toward the upper side in FIG. 1 and the left side in FIG. 3. By this fact, the second chip stack 130 which has a step shape when viewed in its entirety may be formed. The offset stacking direction of the second main semiconductor chips 134 may be referred to as a second offset direction. The second offset direction may be opposite to the first offset direction. According to such offset stacking, a second side of an upper surface of each of the remaining second main semiconductor chips 134, except the uppermost second main semiconductor chip 134 among the second main semiconductor chips 134, may be exposed without being covered by the second main semiconductor chip 134 lying immediately thereon. For example, a lower side edge of the upper surface of each of the remaining second main semiconductor chips 134 in FIG. 1 and the right side edge of the upper surface of each of the remaining second main semiconductor chips 134 in FIG. 3 may be exposed. The uppermost second main semiconductor chip 134 may be in a state in which its entire upper surface is exposed. Second chip pads 135 may be disposed on the exposed portions of the remaining second main semiconductor chips 134 except the uppermost second main semiconductor chip 134, and second chip pads 135 of the uppermost second main semiconductor chip 134 may also be disposed at the same positions as the second chip pads 135 of the remaining second main semiconductor chips 134. A plurality of second chip pads 135 may be arranged in a line in the second direction at the second side edge of the upper surface of each of the second main semiconductor chips 134. However, the present disclosure is not limited thereto, and the number and arrangement of the second chip pads 135 at the second side edge of the upper surface of each of the second main semiconductor chips 134 may be variously modified.

In the case where the second main semiconductor chips 134 are the same semiconductor chips as the first main semiconductor chips 124, each second main semiconductor chip 134 may correspond to a state in which each first main semiconductor chip 124 is rotated by 180 degrees about one axis extending in the vertical direction.

Each of the second main semiconductor chips 134 may be attached to the second main semiconductor chip 134 lying immediately thereunder or the uppermost first main semiconductor chip 124 of the first chip stack 120, by a second adhesive layer 132. The second adhesive layer 132 may be formed on the lower surface of each of the second main semiconductor chips 134 to have a shape overlapping with the lower surface.

The second chip stack 130 or the second main semiconductor chips 134 may have a planar area smaller than the sub semiconductor package 110, and may have a planar area larger than the sub semiconductor chip 114. The second chip stack 130 may be disposed to expose at least the both side edges of the sub semiconductor package 110 in the first direction. That is, the second chip stack 130 may be disposed to expose the redistribution pads 118BP.

Second interconnectors 137 may connect the second chip pads 135 adjacent in the vertical direction with each other, and may electrically connect the second chip pads 135 of the lowermost second main semiconductor chip 134 with the upper surface substrate pads 102 disposed at the second side edge of the substrate 100 in the first direction. By this fact, the second main semiconductor chips 134 may be electrically connected with one another, and the second chip stack 130 may be electrically connected with the substrate 100. The second interconnectors 137 may be bonding wires. However, the present embodiment is not limited thereto, and various types of electrical interconnectors may be used as the second interconnectors 137.

In the top views of FIGS. 1 and 2, the sub package interconnectors 117, the first interconnectors 127 and the second interconnectors 137 are illustrated by solid lines and dotted lines for the sake of convenience in distinction. However, it is to be noted that, as a matter of course, such solid lines and dotted lines do not reflect the actual shapes of the interconnectors 117, 127, and 137.

The sub semiconductor package 110, the first chip stack 120 and the second chip stack 130 may be covered by a molding layer 150 which is formed over the substrate 100. The molding layer 150 may include various molding materials such as an EMC.

The external connection terminals 140 described above may include solder balls. However, the present disclosure is not limited thereto, and various conductive terminals such as bumps may be used as the external connection terminals 140.

In the semiconductor package described above, the first chip stack 120 may be recognized as a single semiconductor chip while being connected with the upper surface substrate pads 102 of the substrate 100 through the first interconnectors 127. Also, the second chip stack 130 may be recognized as another single semiconductor chip different from the first chip stack 120 while being connected with the upper surface substrate pads 102 of the substrate 100 through the second interconnectors 137. The sub semiconductor chip 114 may be connected with the upper surface substrate pads 102 of the substrate 100 through the redistribution structure 118 and the sub package interconnectors 117.

Meanwhile, in the semiconductor package described above, the sub package interconnector 117 may be connected to the upper surface substrate pad 102 alone, the first interconnector 127 may be connected to the upper surface substrate pad 102 alone, the second interconnector 137 may be connected to the upper surface substrate pad 102 alone, the sub package interconnector 117 and the first interconnector 127 may be commonly connected to the upper surface substrate pad 102, or the sub package interconnector 117 and the second interconnector 137 may be commonly connected to the upper surface substrate pad 102. The upper surface substrate pad 102 to which the sub package interconnector 117 is connected alone may function as a power voltage supply pad or a signal transmission pad for the sub semiconductor chip 114. The upper surface substrate pad 102 to which the first interconnector 127 is connected alone may function as a power voltage supply pad or a signal transmission pad for the first chip stack 120. The upper surface substrate pad 102 to which the second interconnector 137 is connected alone may function as a power voltage supply pad or a signal transmission pad for the second chip stack 130. The upper surface substrate pad 102 to which the sub package interconnector 117 and the first interconnector 127 are commonly connected, and/or the upper surface substrate pad 102 to which the sub package interconnector 117 and the second interconnector 137 are commonly connected, may function as a ground voltage supply pad. This may mean that power is supplied, or a signal is transmitted from the substrate 100 to each of the sub semiconductor chip 114, the first chip stack 120, and the second chip stack 130.

In particular, supplying power or signal transmission to the sub semiconductor chip 114 may be performed through the redistribution conductive layer 118B. However, because a large number of redistribution conductive layers 118B are disposed in a limited space, a pitch and/or line width of the redistribution conductive layers 118B may be reduced. In this case, impedance of the redistribution conductive layer 118B may be increased, and thus a problem of interrupting supplied power may be caused. To solve this problem, as shown in the planar view of FIG. 2, the sub semiconductor package 110 may further include a capacitor (see dotted square) which is connected to the redistribution conductive layers 118B. The capacitor will be described in more detail with reference to FIGS. 4 to 6 below.

Referring to FIGS. 4 to 6, the sub chip pads 115 on the upper surface of the sub semiconductor chip 114 may include a signal sub chip pad 115-S, a ground sub chip pad 115-G, and a power sub chip pad 115-P. The redistribution conductive layers 118B may include a signal redistribution conductive layer 118B-S connected to the signal sub chip pad 115-S, a ground redistribution conductive layer 118B-G connected to the ground sub chip pad 115-G, and a power redistribution conductive layer 118B-P connected to the power sub chip pad 115-P. A signal redistribution pad 118BP-S may be disposed at an end of the signal redistribution conductive layer 118B-S, a ground redistribution pad 118BP-G may be disposed at an end of the ground redistribution conductive layer 118B-G, and a power redistribution pad 118BP-P may be disposed at an end of the power redistribution conductive layer 118B-P. The sub semiconductor chip 114 may receive a signal from the substrate (see 100 in FIGS. 1 to 3) through the signal redistribution conductive layer 118B-S. Further, the sub semiconductor chip 114 may be supplied with a ground voltage from the substrate (see 100 in FIGS. 1 to 3) through the ground redistribution conductive layer 118B-G. Further, the sub semiconductor chip 114 may be supplied with a power voltage from the substrate (see 100 in FIGS. 1 to 3) through the power redistribution conductive layer 118B-P. That is, the ground redistribution conductive layer 118B-G and the power redistribution conductive layer 118B-P may correspond to a power supply path from the substrate 100 to the sub semiconductor chip 114.

A capacitor 160 including a first electrode 162, a second electrode 164, and a body portion 166 therebetween may be disposed in the sub molding layer 116. The body portion 166 may have various structures as long as it can store electric charges according to a voltage applied to the first and second electrodes 162 and 164. As an example, the capacitor 160 may be an MLCC (Multi-Layer Ceramic Capacitor). In this case, the body portion 166 may have a structure in which multilayer ceramic dielectric layers and multilayer internal electrodes are alternately stacked.

The capacitor 160 may be embedded with the sub semiconductor chip 114 in the sub molding layer 116. That is, side surfaces and a lower surface of the capacitor 160 may be surrounded by the sub molding layer 116. On the other hand, an upper surface of the capacitor 160, in particular, upper surfaces of the first and second electrodes 162 and 164 may be exposed by being positioned at substantially the same height as the upper surface of the sub molding layer 116. The upper surface of the first electrode 162 may be connected to the ground redistribution conductive layer 118B-G, and the upper surface of the second electrode 164 may be connected to the power redistribution conductive layer 118B-P. More specifically, the ground redistribution conductive layer 118B-G and the power redistribution conductive layer 118B-P may be connected to the upper surface of the first electrode 162 and the upper surface of the second electrode 164, respectively, through the openings of the first redistribution insulating layer 118A. On the other hand, the body portion 166 may be insulated from the redistribution conductive layer 118B. For this reason, an opening may not exist in the first redistribution insulating layer 118A in a portion corresponding to the body portion 166. For reference, for convenience of description, the first electrode 162 of the capacitor 160 is indicated by a non-hatched rectangle, and the second electrode 164 of the capacitor 160 is indicated by a hatched rectangle. However, the hatching is only for distinguishing between the first electrode 162 and the second electrode 164. In addition, planar shapes of the first electrode 162 and the second electrode 164 may also be variously modified.

As described above, the redistribution conductive layers 118B may also be connected to the sub chip pads 115 through the openings of the first redistribution insulating layer 118A. Accordingly, the upper surface of the first electrode 162 and the upper surface of the second electrode 164 may be positioned at substantially the same height as the upper surface of the sub chip pad 115. The upper surface of the body portion 166 may be positioned at a lower level than the upper surface of the first electrode 162 and/or the second electrode 164, as shown. In this case, the first redistribution insulating layer 118A and the sub molding layer 116 may be interposed between the body portion 166 and the redistribution conductive layer 118B. However, in another embodiment, the upper surface of the body portion 166 may be positioned at substantially the same height as the upper surface of the first electrode 162 and/or the second electrode 164.

The capacitor 160 may be connected to the sub chip pads 115 which supply the power voltage and the ground voltage to the sub semiconductor chip 114, and may function to prevent power shortage occurring during operations of the sub semiconductor chip 114. When the capacitor 160 is disposed adjacent to the sub semiconductor chip 114, the power supply path may be shortened to perform this function more effectively. In the present embodiment, the capacitor 160 may be disposed closer to the sub chip pads 115 than the redistribution pads 118BP.

In the present embodiment, four capacitors 160 may be disposed to face four side surfaces of the sub semiconductor chip 114, respectively. However, the present disclosure is not limited thereto, and the number and location of the capacitors 160 may be variously modified.

Meanwhile, one or more signal redistribution conductive layers 118B-S may be disposed between the ground redistribution conductive layer 118B-G and the power redistribution conductive layer 118B-P. The ground redistribution conductive layer 118B-G and the power redistribution conductive layer 118B-P may serve to shield the signal redistribution conductive layer 118B-S therebetween. Accordingly, interference between the signal redistribution conductive layer 118B-S, which is disposed between the ground redistribution conductive layer 118B-G and the power redistribution conductive layer 118B-P, and another signal redistribution conductive layer 118B-S, may be suppressed. For reference, in this case, the body portion 166 may overlap the one or more signal redistribution conductive layers 118B-S disposed between the ground redistribution conductive layer 118B-G and the power redistribution conductive layer 118B-P.

According to the semiconductor package described above, the following effects may be achieved.

First, as the sub chip pads 115 are disposed along the entire edges of the sub semiconductor chip 114, a relatively large number of sub chip pads 115 may be disposed as compared to the size of the sub semiconductor chip 114. In addition, by redistributing the sub chip pads 115 through using a fan-out technology, the connection between the sub chip pads 115 and the chip pads 125 and 135 of the main semiconductor chips 124 and 134 may be easily implemented. For example, if bonding wires are directly connected to the sub semiconductor chip 114, the disposition of the sub chip pads 115 may be restricted due to physical limitations such as the size and movement radius of wire capillaries. On the other hand, as in the present embodiment, if the sub chip pads 115 are redistributed using the redistribution pads 118BP through the fan-out technology, design might not be affected by such limitations.

Furthermore, because the sub semiconductor package 110 larger than the first main semiconductor chips 124 is disposed under the first chip stack 120 by using the fan-out technology, the first chip stack 120 may be stably formed. In a structure in which the first chip stack 120 is formed on the sub semiconductor chip 114, if the sub semiconductor chip 114 is smaller than the first main semiconductor chips 124, a problem may be caused in that the first chip stack 120 is inclined. By substantially increasing the area of the sub semiconductor chip 114 using the fan-out technology, such a problem might not be caused.

Furthermore, by adjusting the shapes and/or arrangements of the redistribution conductive layers 118B connecting the sub chip pads 115 and the redistribution pads 118BP to cause the redistribution conductive layers 118B to have similar lengths, the operation characteristics of the semiconductor package may be secured. For example, when a first channel which is connected from the first chip stack 120 to the substrate 100 and a second channel which is connected from the second chip stack 130 to the substrate 100 exist, a path of the first channel and a path of the second channel may have similar lengths. Therefore, it may be possible to maximally prevent the transfer rates of signals, for example, data, from becoming different from channel to channel.

Furthermore, by arranging the capacitor 160 adjacent to the sub semiconductor chip 114 in the sub molding layer 116, even if the pitch and/or line width of the redistribution conductive layer 118B decreases, supplying power to the sub semiconductor chip 114 may be facilitated.

Furthermore, by placing the one or more signal redistribution conductive layers 118B-S between the ground redistribution conductive layer 118B-G and the power redistribution conductive layer 118B-P, interference between the signal redistribution conductive layers 118B-S may be suppressed.

Furthermore, compared to a case where a capacitor is disposed around the sub semiconductor package 110, when the capacitor 160 is disposed to connect to the redistribution conductive layers 118B in the sub semiconductor package 110 as in the present embodiment, an alternating current path through the capacitor 160 may be shortened. Therefore, the impedance of the power supply path may be further reduced. This will be further described with reference to FIGS. 7A and 7B.

Figure 7A:
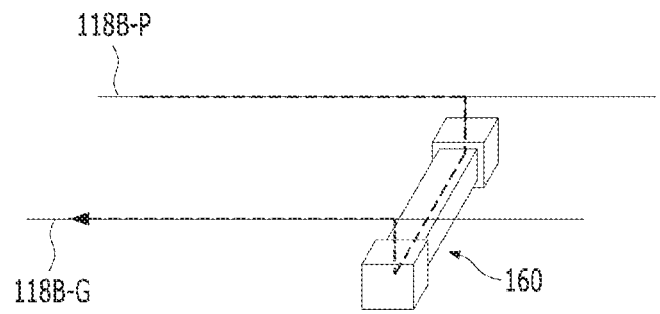
FIG. 7A is a view for explaining an example of an effect of a semiconductor package according to an embodiment of the present disclosure.
Figure 7B:
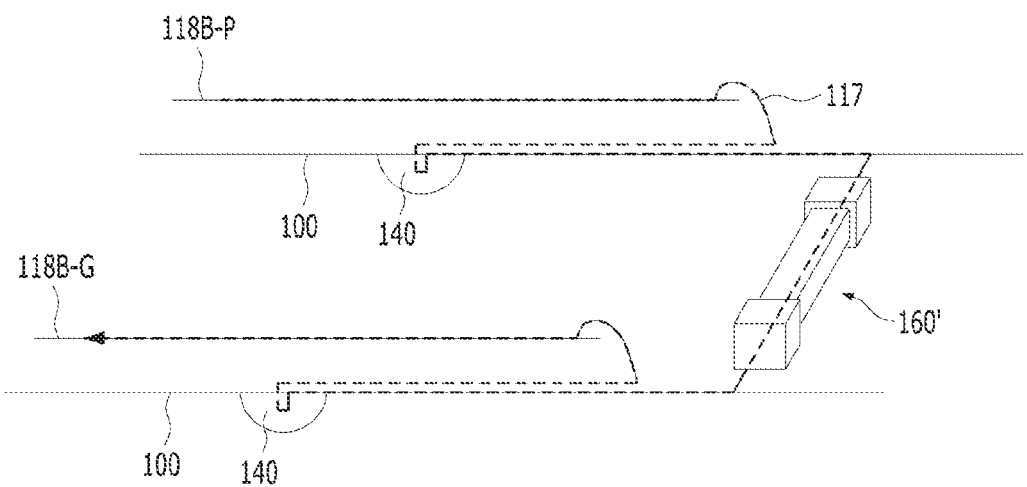
FIG. 7B is a view for explaining an effect of a semiconductor package according to a comparative example.

FIG. 7A is a view for explaining an example of an effect of a semiconductor package according to an embodiment of the present disclosure, and FIG. 7B is a view for explaining an effect of a semiconductor package according to a comparative example. FIG. 7B illustrates a case in which a capacitor 160' is separately disposed around the sub semiconductor package 110, unlike the present embodiment.

Referring to FIG. 7A, because the capacitor 160 is connected to a certain point of each of the ground redistribution conductive layer 118B-G and the power redistribution conductive layer 118B-P, a short alternating current path (see dotted arrow) passing through a portion of the power redistribution conductive layer 118B-P, the capacitor 160, and a portion of the ground redistribution conductive layer 118B-G, may be formed.

On the other hand, referring to FIG. 7B, a long alternating current path (see dotted arrow) passing through the entirety of the power redistribution conductive layer 118-P, the sub package interconnector 117, the substrate 100, the external connection terminal 140 for supplying the power voltage, the substrate 100, the capacitor 160', the substrate 100, the external connection terminal 140 for supplying the ground voltage, the substrate 100, the sub package interconnector 117, and the entirety of the ground redistribution conductive layer 118B-G, may be formed.

As a result, according to the present embodiment as shown in FIG. 7A, a short alternating current path passing through the capacitor 160 may be formed, and thus, the impedance of the power supply path may be reduced. Therefore, supplying power may be easily performed.

Figure 8:
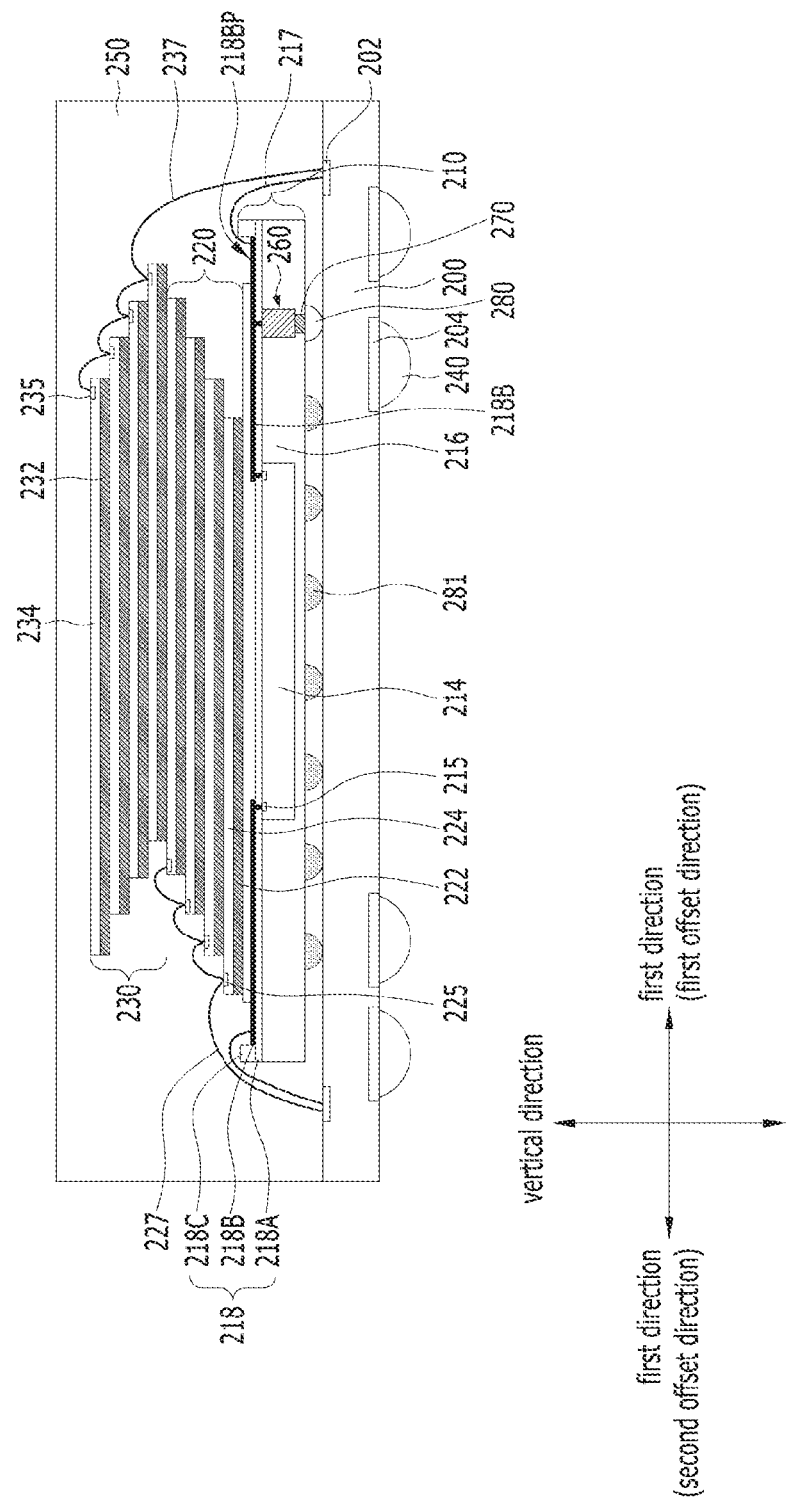
FIG. 8 is a cross-sectional view illustrating a semiconductor package according to another embodiment of the present disclosure.
Figure 9:
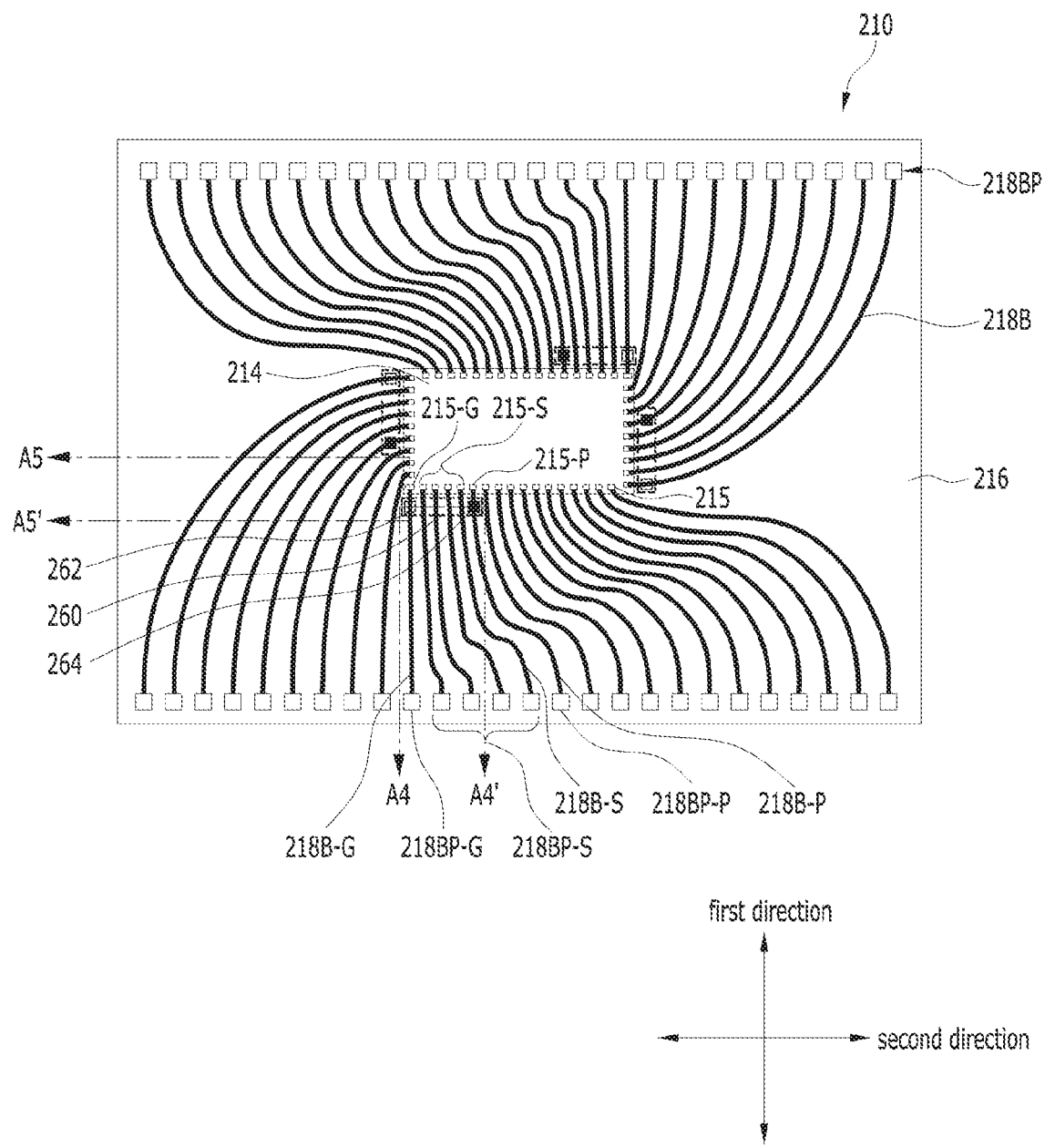
FIG. 9 is a planar view illustrating a sub semiconductor package of FIG. 8.
Figure 10:
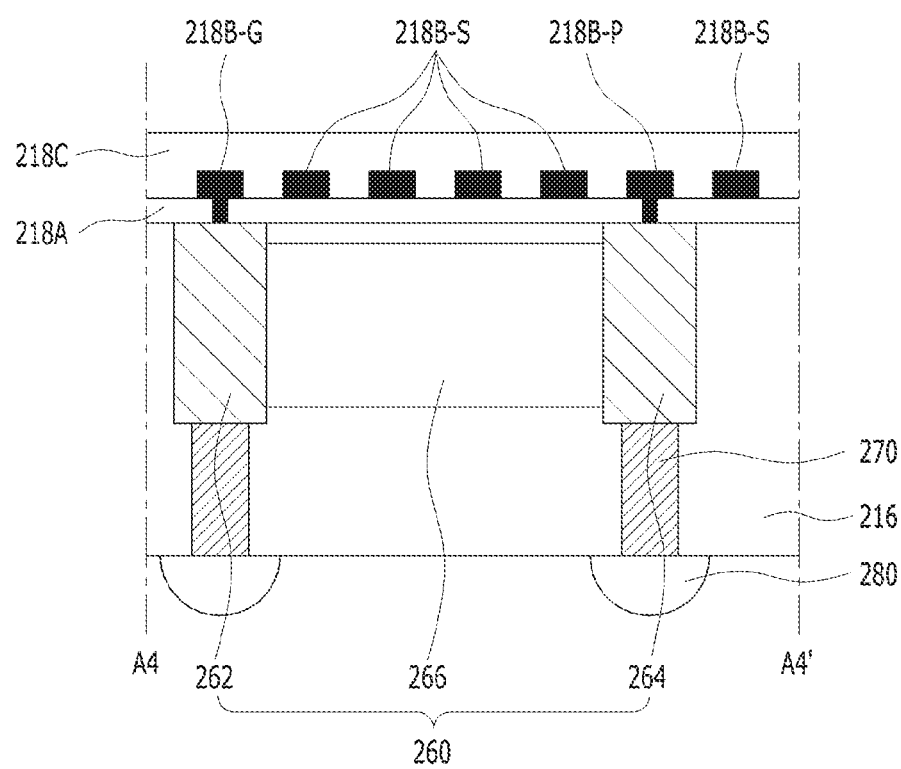
FIG. 10 is a cross-sectional view taken along a line A4-A4' of FIG. 9.
Figure 11:
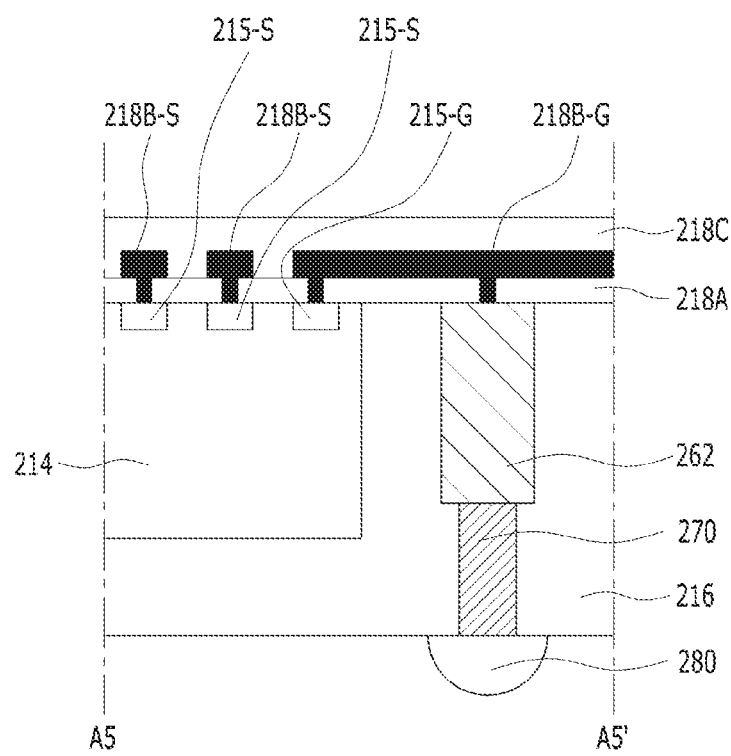
FIG. 11 is a cross-sectional view taken along a line A5-A5' of FIG. 9.

FIG. 8 is a cross-sectional view illustrating a semiconductor package according to another embodiment of the present disclosure, FIG. 9 is a planar view illustrating a sub semiconductor package of FIG. 8, FIG. 10 is a cross-sectional view taken along a line A4-A4' of FIG. 9, and FIG. 11 is a cross-sectional view taken along a line A5-A5' of FIG. 9. FIG. 8 is based on the cross-section along the line A1-A1' of FIG. 1. Hereinafter, differences from the above-described embodiment will be mainly described.

First, referring to FIGS. 9 to 11, a sub semiconductor package 210 of the present embodiment may include a sub semiconductor chip 214, a sub molding layer 216 surrounding at least side surfaces of the sub semiconductor chip 214, a redistribution structure including a first redistribution insulating layer 218A, redistribution conductive layers 218B and a second redistribution insulating layer 218C, and formed over upper surfaces of the sub semiconductor chip 214 and the sub molding layer 216, and a capacitor 260 disposed in the sub molding layer 216 and including a first electrode 262, a second electrode 264, and a body portion 266 therebetween. Sub chip pads 215 may be disposed on the upper surface of the sub semiconductor chip 214. The sub chip pads 215 may include a signal sub chip pad 215-S, a ground sub chip pad 215-G, and a power sub chip pad 215-P. The redistribution conductive layers 218B may include a signal redistribution conductive layer 218B-S connected to the signal sub chip pad 215-S, a ground redistribution conductive layer 218-G connected to the ground sub chip pad 215-G, and a power redistribution conductive layer 218B-P connected to the power sub chip pad 215-P. A signal redistribution pad 218BP-S may be disposed at an end of the signal redistribution conductive layer 218B-S, a ground redistribution pad 218BP-G may be disposed at an end of the ground redistribution conductive layer 218B-G, and a power redistribution pad 218BP-P may be disposed at an end of the power redistribution conductive layer 218B-P. The ground redistribution conductive layer 218B-G may be connected to the ground sub chip pad 215-G and the first electrode 262 of the capacitor 260 through openings of the first redistribution insulating layer 218A. The power redistribution conductive layer 218B-P may be connected to the power sub-chip pad 215-P and the second electrode 264 of the capacitor 260 through openings of the first redistribution insulating layer 218A.

Furthermore, the sub-semiconductor package 210 may further include sub vias 270 connected to the first and second electrodes 262 and 264 of the capacitor 260, respectively. Upper surfaces of the sub vias 270 may be connected to lower surfaces of the first and second electrodes 262 and 264, respectively. The sub vias 270 may extend from the lower surfaces of the first and second electrodes 262 and 264 to a lower surface of the sub molding layer 216 by passing through the sub molding layer 216. Lower surfaces of the sub vias 270 may be exposed by being positioned at the same height as the lower surface of the sub molding layer 216.

The sub semiconductor package 210 may be electrically connected to the substrate (see 200 in FIG. 8) through interconnectors 280 that are connected to the exposed lower surfaces of the sub vias 270. The interconnectors 280 connected to the sub vias 270 will be referred to as a second sub package interconnectors 280 to distinguish them from first sub package interconnectors described later. The second sub package interconnector 280 may include a conductor having various three-dimensional shapes, such as a ball and a pillar, rather than a two-dimensional shape such as a wire. For example, the second sub package interconnector 280 may include a solder ball or a metal bump. Although not illustrated, an additional insulating layer may be disposed between the lower surface of the sub molding layer 216 and the second sub package interconnectors 280. Openings may be formed in the additional insulating layer to expose the sub vias 270 to be connected to the second sub package interconnectors 280.

Hereinafter, the electrical connection between the sub semiconductor package 210 and the substrate 200 will be described in more detail with reference to FIG. 8 together. For reference, FIG. 8 is shown based on the cross-section corresponding to the line A1-A1' of FIG. 1, so that the capacitor 260, and the sub via 270 and the second sub package interconnector 280 connected thereto are not actually visible. However, for convenience of description, one capacitor 260, and the sub via 270 and the second sub package interconnector 280 connected thereto are illustrated.

Referring to FIG. 8 together with FIGS. 9 to 11, the sub semiconductor package 210 may be electrically connected to the substrate 200 through the first sub package interconnector 217 and the second sub package interconnector 280.

The first sub package interconnectors 217 may be substantially the same as the sub package interconnectors 117 of the above-described embodiment. That is, the first sub package interconnector 217 may connect the redistribution pad 218BP and the substrate 200 to each other, thereby providing an electrical connection between the sub semiconductor chip 214 and the substrate 200. The first sub package interconnector 217 may be a bonding wire.

On the other hand, the second sub package interconnector 280 may be connected to the redistribution conductive layer 218B through the sub via 270 and each of the first and second electrodes 262 and 264 of the capacitor 260. In particular, the second sub package interconnector 280 may be connected to a certain point of the redistribution conductive layer 218B, except for the redistribution pad 218BP. Therefore, an electrical connection between the sub semiconductor chip 214 and the substrate 200 may be provided.

Because the second sub package interconnector 280 is interposed between the sub semiconductor package 210 and the substrate 200, the sub molding layer 216 may be spaced apart from the substrate 200 at a predetermined distance while not being attached to the substrate 200, unlike the sub molding layer 116 of the above-described embodiment. This distance may correspond to a height of the second sub package interconnector 280. The second sub package interconnector 280 may provide an electrical connection between the sub semiconductor package 210 and the substrate 200, and may also function to support the sub semiconductor package 210. A plurality of second sub package interconnectors 280 may be disposed to overlap each of the first and second electrodes 262 and 264 of the capacitor 260. Because the first and second electrodes 262 and 264 of the capacitor 260 are disposed along a periphery of the sub semiconductor chip 214, the second sub package interconnector 280 may sufficiently support the sub semiconductor package 210. Furthermore, one or more dummy second sub package interconnectors 281, which are not connected to the sub via 270, may be additionally disposed over the lower surface of the sub molding layer 216. The dummy second sub package interconnector 281 may prevent the sub semiconductor package 210 from being tilted in a direction, or may withstand a pressure generated when mounting the first chip stack 220 and the second chip stack 230 over the sub semiconductor package 210.

FIG. 8 may further include the first chip stack 220 and the second chip stack 230 disposed over the sub semiconductor package 210. The first chip stack 220 may include a plurality of first main semiconductor chips 224 and a first adhesive layer 222 for attaching each of the first main semiconductor chips 224 to its lower structure. The first main semiconductor chips 224 may be offset-stacked in a first offset direction so that first chip pads 225 disposed on an upper surface of each of the first main semiconductor chips 224 are exposed. The first chip stack 220 may be electrically connected to the substrate 200 through a first interconnector 227. The second chip stack 230 include a plurality of second main semiconductor chips 234 and a second adhesive layer 232 for attaching each of the second main semiconductor chips 234 to its lower structure. The second main semiconductor chips 234 may be offset-stacked in a second offset direction so that second chip pads 235 disposed on an upper surface of each of the second main semiconductor chips 234 are exposed. The second chip stack 230 may be electrically connected to the substrate 200 through a second interconnector 237. The first and second chip stacks 220 and 230 may be covered with a molding layer 250. An external connection terminal 240 may be disposed over the lower surface of the substrate 200.

According to the semiconductor package of the present embodiment, it is possible to have all the advantages of the semiconductor package of the above-described embodiment.

Furthermore, as in the present embodiment, when the sub via 270 connected to each of the first and second electrodes 262 and 264 of the capacitor 260 is disposed in the sub semiconductor package 210, and the second sub package interconnector 280 connecting the sub semiconductor package 210 and the substrate 200 is disposed, a direct current path between the sub semiconductor package 210 and the substrate 200 may be shortened, thereby reducing the impedance of the power supply path. Furthermore, multiple direct current paths may be formed, so that inductance of the power supply path may be reduced. As a result, supplying power between the sub semiconductor package 210 and the substrate 200 may be easier. This will be further described with reference to FIGS. 12A and 12B.

Figure 12A:
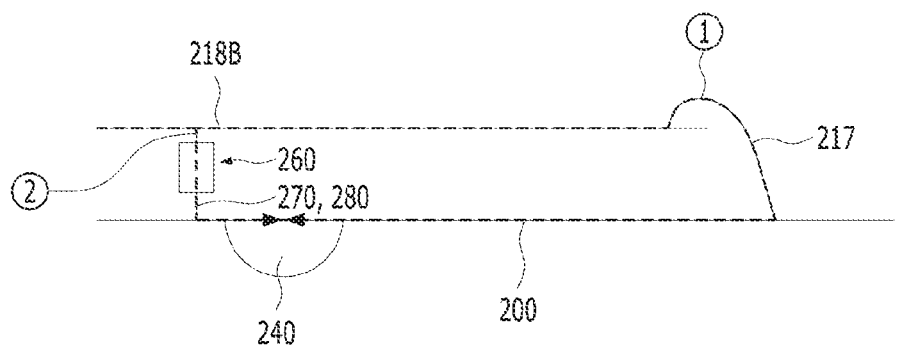
FIG. 12A is a view for explaining an example of an effect of a semiconductor package according to another embodiment of the present disclosure.
Figure 12B:
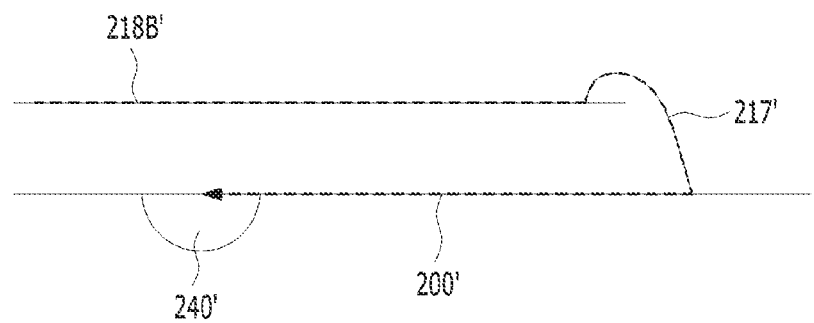
FIG. 12B is a view for explaining an effect of a semiconductor package according to a comparative example.

FIG. 12A is a view for explaining an example of an effect of a semiconductor package according to another embodiment of the present disclosure, and FIG. 12B is a view for explaining an effect of a semiconductor package according to a comparative example. FIG. 12B illustrates a case in which a capacitor and a sub via are not present, unlike the present embodiment.

Referring to FIG. 12A, a relatively long direct current path (see dotted arrow ①) may be formed through the redistribution conductive layer 218B, the first sub package interconnector 217, and the substrate 200. Furthermore, a relatively short direct current path (see dotted arrow ②) may be formed through a portion of the redistribution conductive layer 218B, the capacitor 260, the sub via 270, the second sub package interconnector 280, and the substrate 200.

That is, a short direct current path may be obtained as indicated by the dotted arrow ②, and further, multiple direct current paths may be formed as indicated by the dotted arrows ① and ②.

On the other hand, referring to FIG. 12B, in the comparative example, only a relatively long direct current path (see dotted arrow) passing through a redistribution conductive layer 218B', a first sub package interconnector 217', and a substrate 200' may be formed.

As a result, according to the present embodiment as shown in FIG. 12A, it may be possible to form the short direct current path and the multiple direct current paths, so that the impedance and the inductance of the power supply path may be reduced. Therefore, supplying power may be performed easily.

Figure 13:
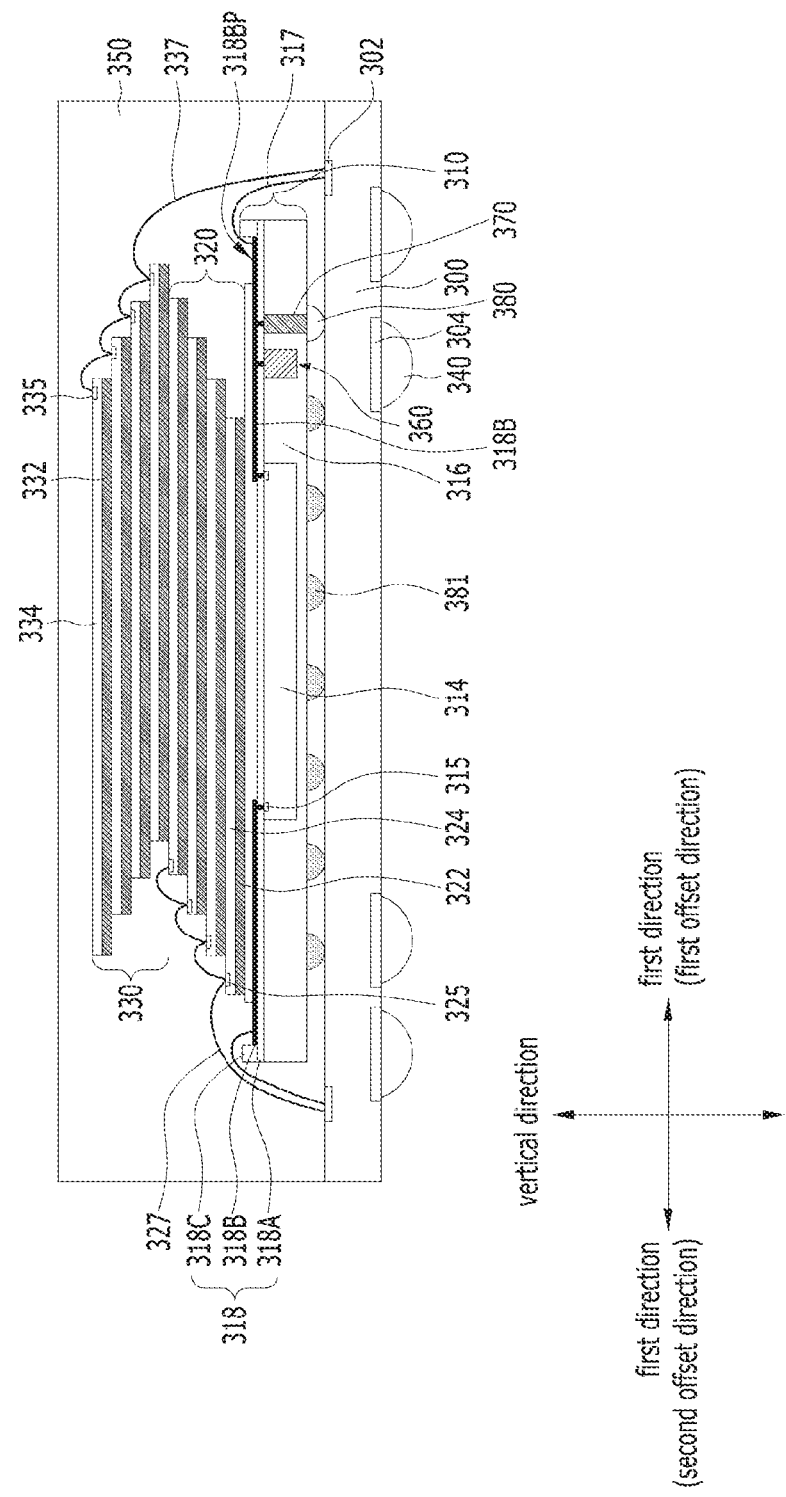
FIG. 13 is a cross-sectional view illustrating a semiconductor package according to another embodiment of the present disclosure.
Figure 14:
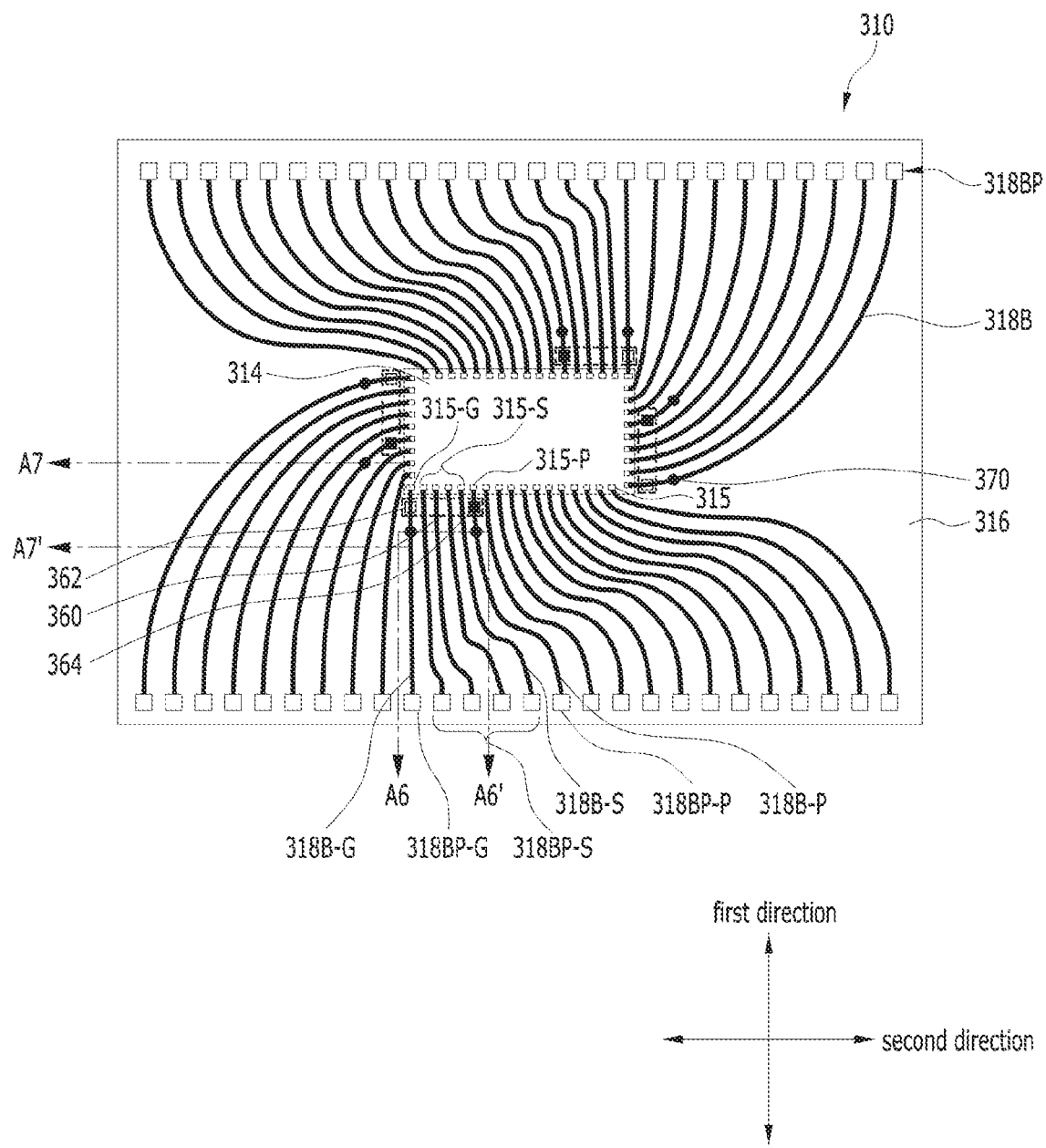
FIG. 14 is a planar view illustrating a sub semiconductor package of the semiconductor package according to another embodiment of the present disclosure.
Figure 15:
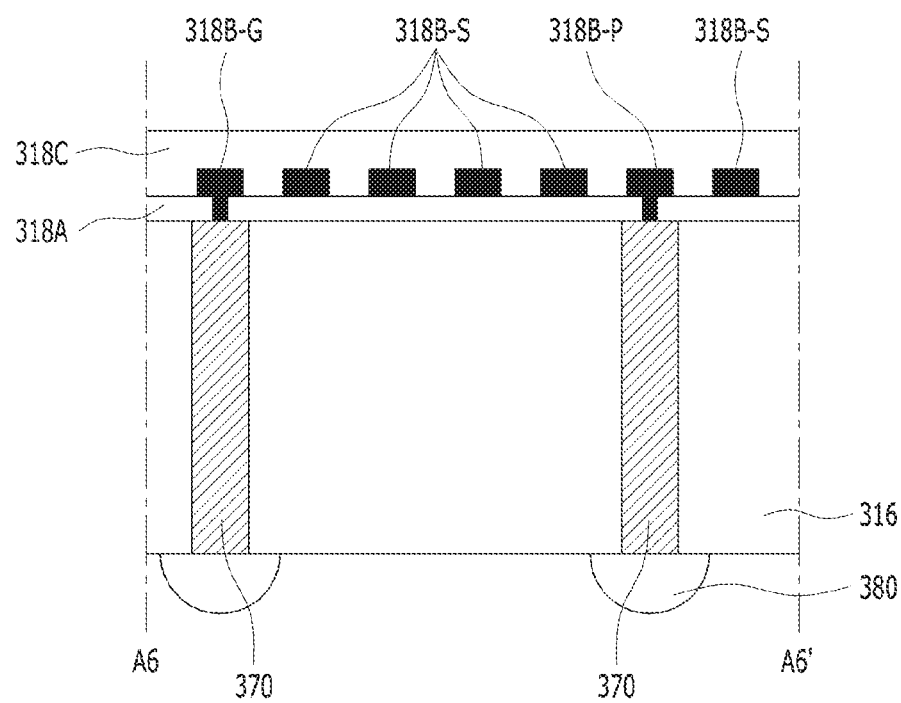
FIG. 15 is a cross-sectional view taken along a line A6-A6' of FIG. 14.
Figure 16:
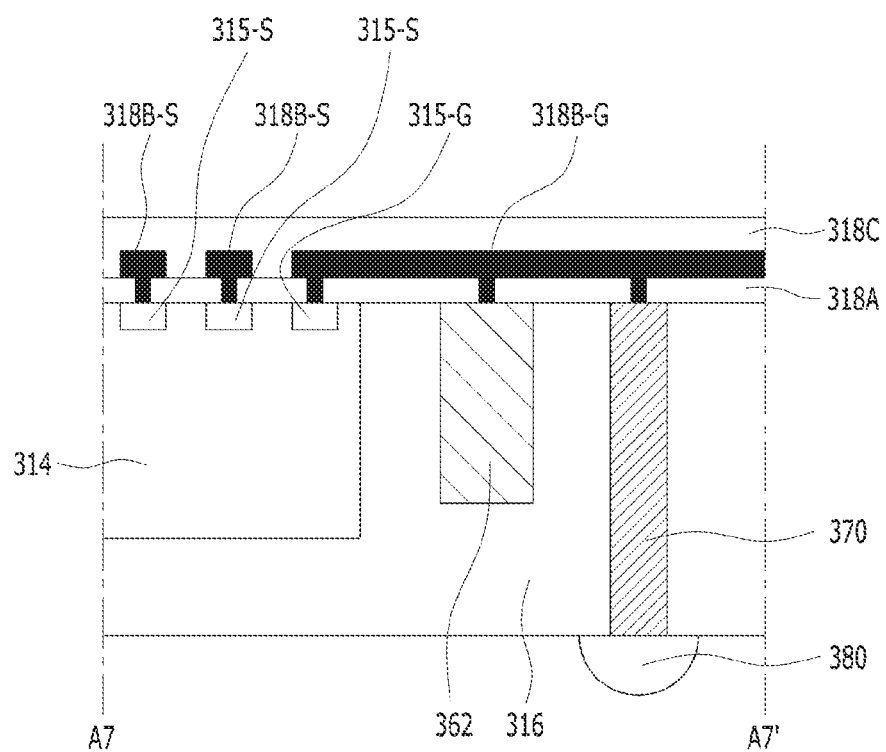
FIG. 16 is a cross-sectional view taken along a line A7-A7' of FIG. 14.

FIG. 13 is a cross-sectional view illustrating a semiconductor package according to another embodiment of the present disclosure, FIG. 14 is a planar view illustrating a sub semiconductor package of the semiconductor package according to another embodiment of the present disclosure, FIG. 15 is a cross-sectional view taken along a line A6-A6' of FIG. 14, and FIG. 16 is a cross-sectional view taken along a line A7-A7' of FIG. 14. Hereinafter, differences from the above-described embodiments will be mainly described.

First, referring to FIGS. 14 to 16, a sub semiconductor package 310 of the present embodiment may include a sub semiconductor chip 314, a sub molding layer 316 surrounding at least side surfaces of the sub semiconductor chip 314, a redistribution structure including a first redistribution insulating layer 318A, redistribution conductive layers 318B, and a second redistribution insulating layer 318C, and formed over upper surfaces of the sub semiconductor chip 314 and the sub molding layer 316, and a capacitor 360 disposed in the sub molding layer 316 and including a first electrode 362, a second electrode 364, and a body portion (not shown) therebetween, similar to the above-described embodiments. Sub chip pads 315 may be disposed on the upper surface of the sub semiconductor chip 314. The sub chip pads 315 may include a signal sub chip pad 315-S, a ground sub chip pad 315-G, and a power sub chip pad 315-P. The redistribution conductive layers 318B may include a signal redistribution conductive layer 318B-S connected to the signal sub chip pad 315-S, a ground redistribution conductive layer 318B-G connected to the ground sub chip pad 315-G, and a power redistribution conductive layer 318B-P connected to the power sub chip pad 315-P. A signal redistribution pad 318BP-S may be disposed at an end of the signal redistribution conductive layer 318B-S, a ground redistribution pad 318BP-G may be disposed at an end of the ground redistribution conductive layer 318B-G, and a power redistribution pad 318BP-P may be disposed at an end of the power redistribution conductive layer 318B-P. The ground redistribution conductive layer 318B-G may be connected to the ground sub chip pad 315-G and the first electrode 362 of the capacitor 360 through openings of the first redistribution insulating layer 318A. The power redistribution conductive layer 318B-P may be connected to the power sub chip pad 315-P and the second electrode 364 of the capacitor 360 through openings of the first redistribution insulating layer 318A.

Furthermore, the sub semiconductor package 310 may further include sub vias 370 connected to the ground redistribution conductive layer 318B-G and the power redistribution conductive layer 318B-P, respectively.

The sub via 370 may be formed to be spaced apart from each of the first electrode 362 and the second electrode 364 of the capacitor 360. However, as described later, the sub via 370 may also be disposed closer to the sub chip pad 315 than the redistribution pad 318BP to shorten a direct current path. Furthermore, the sub via 370 may be located between the first electrode 362 and the ground redistribution pad 318BP-G, and between the second electrode 364 and the power redistribution pad 318BP-P.

The sub via 370 may be formed to penetrate the sub molding layer 316 and extend from the upper surface to the lower surface of the sub molding layer 316. That is, an upper surface of the sub via 370 may be exposed by being positioned at substantially the same height as the upper surface of the sub molding layer 316, and a lower surface of the sub via 370 may be exposed by being positioned at substantially the same height as the lower surface of the sub molding layer 316. Each of the ground redistribution conductive layer 318B-G and the power redistribution conductive layer 318B-P may be connected to the upper surface of the sub via 370 through an opening of the first redistribution insulating layer 318A.

The sub semiconductor package 310 may be electrically connected to a substrate (see 300 of FIG. 13) through a second sub package interconnector 380 that is connected to the lower surface of the sub via 370. The second sub package interconnector 380 may include a conductor having various three-dimensional shapes, such as a ball and a pillar, rather than two-dimensional shapes such as a wire. For example, the second sub package interconnector 380 may include a solder ball or a metal bump. Although not illustrated, an additional insulating layer may be disposed between the lower surface of the sub molding layer 316 and the second sub package interconnector 380. An opening may be formed in the additional insulating layer to expose the sub via 370 to be connected to the second sub package interconnector 380.

Hereinafter, the electrical connection between the sub semiconductor package 310 and the substrate 300 will be described in more detail with reference to FIG. 13 together. For reference, FIG. 13 is shown based on the cross-section corresponding to the line A1-A1' of FIG. 1, so that the capacitor 360, the sub via 370, and second sub package interconnector 380 are not actually visible. However, for convenience of description, one capacitor 360, and the sub via 370 and the second sub package interconnector 380 near the one capacitor 360 are illustrated.

Referring to FIG. 13 together with FIGS. 14 to 16, the sub semiconductor package 310 may be electrically connected to the substrate 300 through a first sub package interconnector 317 and a second sub package interconnector 380.

The first sub package interconnector 317 may be substantially the same as the first sub package interconnector 217 of the above-described embodiment. That is, the first sub package interconnector 317 may provide an electrical connection between the sub semiconductor chip 314 and the substrate 300 by connecting the redistribution pad 318BP and the substrate 300 to each other. The first sub package interconnector 317 may be a bonding wire.

On the other hand, the second sub package interconnector 380 may be connected to the redistribution conductive layer 318B through the sub via 370. In particular, the second sub package interconnector 380 may be connected to a certain point of the redistribution conductive layer 318B, except for the redistribution pad 318BP. Therefore, an electrical connection between the sub semiconductor chip 314 and the substrate 300 may be provided.

Because the second sub package interconnector 380 is interposed between the sub semiconductor package 310 and the substrate 300, the sub molding layer 316 may not be attached to the substrate 300, and may be spaced apart from the substrate 300 by a predetermined distance. This distance may correspond to a height of the second sub package interconnector 380. The second sub package interconnector 380 provides an electrical connection between the sub semiconductor package 310 and the substrate 300, and may also support the sub semiconductor package 310. A plurality of second sub package interconnectors 380 may be disposed adjacent to the first and second electrodes 362 and 364 of the capacitor 360, respectively. That is, because the second sub package interconnectors 380 are disposed along a periphery of the sub semiconductor chip 314, the second sub package interconnectors 380 may sufficiently support the sub semiconductor package 310. A dummy second sub package interconnector 381 which is not connected to the sub via 370 may be additionally disposed over the lower surface of the sub molding layer 316. The dummy second sub package interconnector 381 may prevent the sub semiconductor package 310 from being tilted in a direction, or may withstand a pressure generated when mounting the first chip stack 320 and the second chip stack 330 over the sub semiconductor package 310.

FIG. 13 may further include the first chip stack 320 and the second chip stack 330 disposed over the sub semiconductor package 310. The first chip stack 320 may include a plurality of first main semiconductor chips 324, and a first adhesive layer 322 for attaching each of the first main semiconductor chips 324 to its lower structure. The first main semiconductor chips 324 may be offset-stacked in a first offset direction so that first chip pads 325 disposed on an upper surface of each of the first main semiconductor chips 324 are exposed. The first chip stack 320 may be electrically connected to the substrate 300 through a first interconnector 327. The second chip stack 330 includes a plurality of second main semiconductor chips 334, and a second adhesive layer 332 for attaching each of the second main semiconductor chips 334 to its lower structure. The second main semiconductor chips 334 may be offset-stacked in a second offset direction so that second chip pads 335 disposed on an upper surface of each of the second main semiconductor chips 334 are exposed. The second chip stack 330 may be electrically connected to the substrate 300 through a second interconnector 337. The first and second chip stacks 320 and 330 may be covered with a molding layer 350. An external connection terminal 340 may be disposed over the lower surface of the substrate 300.

According to the semiconductor package of the present embodiment, it may be possible to have all the advantages of the semiconductor package of the above-described embodiments.

In particular, compared to a case where a sub via is not present in the sub semiconductor package 310, when the sub via 370 connected to each of the ground redistribution conductive layer 318B-G and the power redistribution conductive layer 318B-P is disposed in the sub semiconductor package 310, and the second sub package interconnector 380 connecting the sub via 370 and substrate 300 is disposed, a direct current path between the sub semiconductor package 310 and the substrate 300 may be shortened, so that the impedance of the power supply path may be reduced. Furthermore, multiple direct current paths may be formed, so that the inductance of the power supply path may be reduced. As a result, supplying power between the sub semiconductor package 310 and the substrate 300 may be easier. This will be further described with reference to FIGS. 17A and 17B.

Figure 17A:
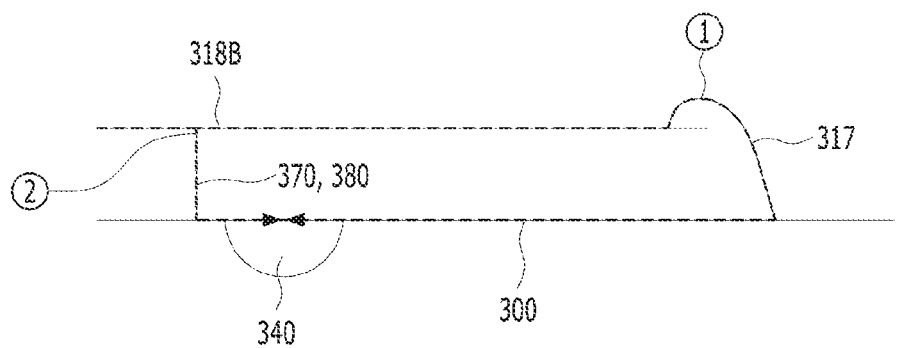
FIG. 17A is a view for explaining an example of the effect of a semiconductor package according to another embodiment of the present disclosure.
Figure 17B:
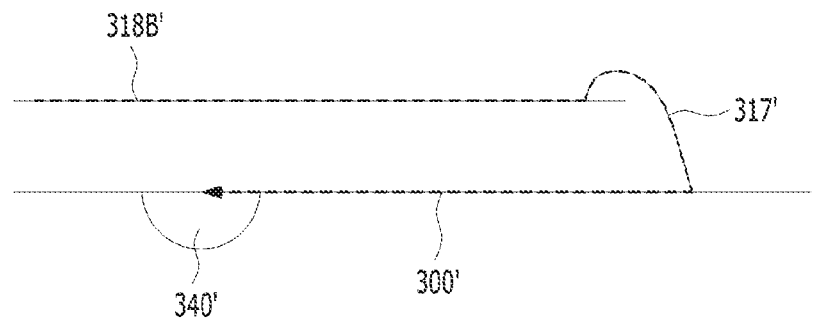
FIG. 17B is a view for explaining an effect of a semiconductor package of a comparative example.

FIG. 17A is a view for explaining an example of the effect of a semiconductor package according to another embodiment of the present disclosure, and FIG. 17B is a view for explaining an effect of a semiconductor package of a comparative example. FIG. 17B shows a case in which a sub via is not present in the sub semiconductor package 310, unlike the present embodiment.

Referring to FIG. 17A, a relatively long direct current path (see dotted arrow ①) may be formed through the redistribution conductive layer 318B, the first sub package interconnector 317, and the substrate 300. Furthermore, a relatively short direct current path (see dotted arrow ②) may be formed through a portion of the redistribution conductive layer 318B, the sub via 370, the second sub package interconnector 380, and the substrate 300.

That is, a short direct current path may be obtained as indicated by the dotted arrow ②, and further, multiple direct current paths may be formed as indicated by the dotted arrows ① and ②.

On the other hand, referring to FIG. 17B, in the comparative example, only a relatively long direct current path (see dotted arrow) passing through a redistribution conductive layer 318B', a first sub package interconnector 317', and a substrate 300' may be formed.

As a result, according to the present embodiment as shown in FIG. 17A, it may be possible to form the short direct current path and the multiple direct current paths, so that the impedance and the inductance of the power supply path may be reduced. Therefore, supplying power may be performed easily.

By the embodiments of the present disclosure, it may be possible to implement a high-capacity and multi-functional semiconductor package by forming a chip stack including one or more main semiconductor chips over a sub semiconductor package. Furthermore, it may be possible to facilitate supplying power in the semiconductor package by disposing a capacitor in the sub semiconductor package.

Figure 18:
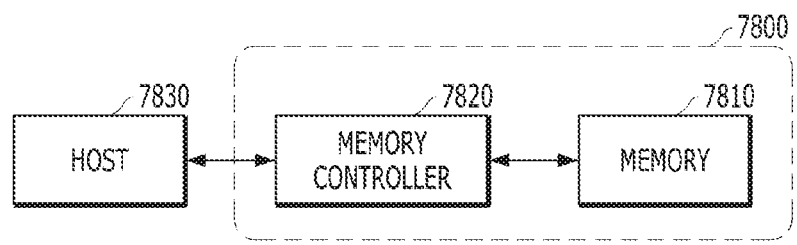
FIG. 18 shows a block diagram illustrating an electronic system employing a memory card including a semiconductor package, according to an embodiment.

FIG. 18 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 19:
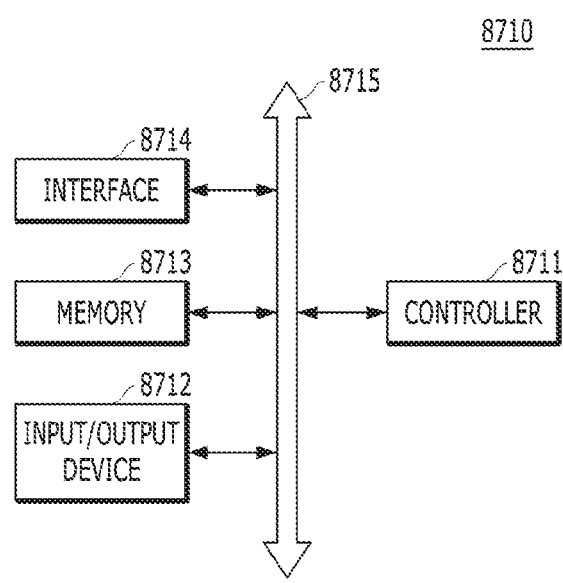
FIG. 19 shows a block diagram illustrating another electronic system including a semiconductor package, according to an embodiment.

FIG. 19 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
   a substrate;
   a sub semiconductor package disposed over the substrate, the sub semiconductor package including a sub semiconductor chip which has chip pads on its upper surface, a molding layer which surrounds side surfaces of the sub semiconductor chip, and a redistribution layer formed over the sub semiconductor chip and the molding layer, the redistribution layer including redistribution conductive layers which are connected to the chip pads of the sub semiconductor chip and extend onto edges of the molding layer while having redistribution pads on their end portions;
   first sub package interconnectors connected to the redistribution pads to electrically connect the sub semiconductor chip and the substrate;
   a capacitor formed in the molding layer and including a first electrode, a second electrode, and a body portion between the first electrode and the second electrode, the first and second electrodes having upper surfaces which are connected to the redistribution conductive layers, respectively; and
   at least one main semiconductor chip formed over the sub semiconductor package and electrically connected to the substrate,
   wherein the sub semiconductor package further includes a sub via penetrating through the molding layer while connected to a lower surface of each of the first electrode and the second electrode, and
   wherein the semiconductor package further comprises:
   a second sub package interconnector disposed between the molding layer and the substrate, the second sub package interconnector being connected to the sub via.

2. The semiconductor package according to claim 1, wherein the first sub package interconnector includes a bonding wire, and
   wherein the second sub package interconnector includes at least one of a solder ball and a conductive bump.

3. The semiconductor package according to claim 1, further comprising:
   a dummy second sub package interconnector disposed between the molding layer and the substrate while not being connected to the sub via.

4. The semiconductor package according to claim 1, wherein a first direct current path passes through the redistribution conductive layer, the first sub package interconnector, and the substrate, and
   wherein a second direct current path passes through the redistribution conductive layer, the first electrode or the second electrode, the sub via, the second sub package interconnect, and the substrate.

5. The semiconductor package according to claim 1, wherein each of the first electrode and the second electrode is disposed closer to the chip pads than the redistribution pads.

6. The semiconductor package according to claim 1 wherein the redistribution layer further includes a redistribution insulating layer formed between the redistribution conductive layers and upper surfaces of the sub semiconductor chip and the molding layer, and
   wherein the redistribution conductive layers are connected to the chip pads, the first electrode, and the second electrode through openings formed in the redistribution insulating layer.

7. The semiconductor package according to claim 1, wherein the at least one main semiconductor chip includes memory, and
   the sub semiconductor chip includes a memory controller.

8. A semiconductor package comprising:
   a substrate;
   a sub semiconductor package disposed over the substrate, the sub semiconductor package including a sub semiconductor chip which has chip pads on its upper surface, a molding layer which surrounds side surfaces of the sub semiconductor chip, and a redistribution layer formed over the sub semiconductor chip and the molding layer, the redistribution layer including redistribution conductive layers which are connected to the chip pads of the sub semiconductor chip and extend onto edges of the molding layer while having redistribution pads on their end portions;
   first sub package interconnectors connected to the redistribution pads to electrically connect the sub semiconductor chip and the substrate;
   a capacitor formed in the molding layer and including a first electrode, a second electrode, and a body portion between the first electrode and the second electrode, the first and second electrodes having upper surfaces which are connected to the redistribution conductive layers, respectively; and at least one main semiconductor chip formed over the sub semiconductor package and electrically connected to the substrate, wherein the sub semiconductor package further includes a sub via penetrating through the molding layer and having an upper surface connected to the redistribution conductive layer, and wherein the semiconductor package further comprises:

a second sub package interconnector disposed between the molding layer and the substrate, the second sub package interconnector being connected to the sub via, wherein a first direct current path passes through the redistribution conductive layer, the first sub package interconnector, and the substrate, and wherein a second direct current path passes through the redistribution conductive layer, the sub via, the second sub package interconnector, and the substrate.

9. The semiconductor package according to claim 8, wherein the sub via is connected to the redistribution conductive layer to which the first electrode is connected while being spaced apart from the first electrode, and wherein the sub via is connected to the redistribution conductive layer to which the second electrode is connected while being spaced apart from the second electrode.

10. The semiconductor package according to claim 8, wherein the sub via is disposed between the first electrode and the redistribution pad or between the second electrode and the redistribution pad.

11. The semiconductor package according to claim 8, wherein the first sub package interconnector includes a bonding wire, and wherein the second sub package interconnector includes at least one of a solder ball and a conductive bump.

12. The semiconductor package according to claim 8, further comprising:

a dummy second sub package interconnector disposed between the molding layer and the substrate while not being connected to the sub via.

13. The semiconductor package according to claim 8, wherein each of the first electrode and the second electrode is disposed closer to the chip pads than the redistribution pads.

14. The semiconductor package according to claim 8, wherein the redistribution layer further includes a redistribution insulating layer formed between the redistribution conductive layers and upper surfaces of the sub semiconductor chip and the molding layer, and wherein the redistribution conductive layers are connected to the chip pads, the first electrode, and the second electrode through openings formed in the redistribution insulating layer.

15. The semiconductor package according to claim 8, wherein the at least one main semiconductor chip includes memory, and the sub semiconductor chip includes a memory controller.

16. A semiconductor package comprising:

a substrate;

a sub semiconductor package disposed over the substrate, the sub semiconductor package including a sub semiconductor chip which has chip pads on its upper surface, a molding layer which surrounds side surfaces of the sub semiconductor chip, and a redistribution layer formed over the sub semiconductor chip and the molding layer, the redistribution layer including redistribution conductive layers which are connected to the chip pads of the sub semiconductor chip and extend onto edges of the molding layer while having redistribution pads on their end portions;

first sub package interconnectors connected to the redistribution pads to electrically connect the sub semiconductor chip and the substrate;

a capacitor formed in the molding layer and including a first electrode, a second electrode, and a body portion between the first electrode and the second electrode, the first and second electrodes having upper surfaces which are connected to the redistribution conductive layers, respectively; and at least one main semiconductor chip formed over the sub semiconductor package and electrically connected to the substrate, wherein the substrate includes substrate pads disposed at each of a first side edge and a second side edge of the substrate in a first direction, and wherein the at least one main semiconductor chip includes:

at least one first main semiconductor chip connected to the substrate pads disposed at the first side edge of the substrate through first interconnectors; and at least one second main semiconductor chip connected to the substrate pads disposed at the second side edge of the substrate through second interconnectors.

17. The semiconductor package according to claim 16, wherein the at least one first main semiconductor chip comprises a plurality of first main semiconductor chips which are offset-stacked from a first side toward a second side in the first direction, and wherein the at least one second main semiconductor chip comprises a plurality of second main semiconductor chips which are offset-stacked from the second side toward the first side in the first direction.

18. The semiconductor package according to claim 16, wherein the redistribution pads are disposed at each of a first side edge and a second side edge of the molding layer in the first direction, and wherein the first sub package interconnectors connect the redistribution pads disposed at the first side edge of the molding layer and the substrate pads disposed at the first side edge of the substrate to each other, and connect the redistribution pads disposed at the second side edge of the molding layer and the substrate pads disposed at the second side edge of the substrate to each other.

19. The semiconductor package according to claim 18, wherein the chip pads of the sub semiconductor chip are disposed along first and second side edges of the sub semiconductor chip in the first direction, and along first and second side edges of the sub semiconductor chip in a second direction, the second direction being perpendicular to the first direction.

20. The semiconductor package according to claim 19, wherein the chip pads disposed at the first side edges of the sub semiconductor chip in the first and second directions extend toward the redistribution pads disposed at the first side edge of the molding layer in the first direction, and wherein the chip pads disposed at the second side edges of the sub semiconductor chip in the first and second directions extend toward the redistribution pads disposed at the second side edge of the molding layer in the first direction.

21. The semiconductor package according to claim 16, wherein each of the first electrode and the second electrode is disposed closer to the chip pads than the redistribution pads.

22. The semiconductor package according to claim 16, wherein the redistribution layer further includes a redistribution insulating layer formed between the redistribution conductive layers and upper surfaces of the sub semiconductor chip and the molding layer, and wherein the redistribution conductive layers are connected to the chip pads, the first electrode, and the second electrode through openings formed in the redistribution insulating layer.

23. The semiconductor package according to claim 16, wherein the at least one main semiconductor chip includes memory, and the sub semiconductor chip includes a memory controller.

\* \* \* \* \*